(12) United States Patent
Seong et al.

(10) Patent No.: US 9,793,155 B2
(45) Date of Patent: Oct. 17, 2017

(54) METHOD OF FABRICATING FLASH MEMORY DEVICE

(71) Applicant: Samsung Electronics Co., Ltd., Suwon-si, Gyeonggi-do (KR)

(72) Inventors: Ho-Jun Seong, Suwon-si (KR); Jee-hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 34 days.

(21) Appl. No.: 14/734,287

(22) Filed: Jun. 9, 2015

(65) Prior Publication Data
US 2016/0056170 A1    Feb. 25, 2016

(30) Foreign Application Priority Data

Aug. 20, 2014 (KR) .................. 10-2014-0108453

(51) Int. Cl.
| | |
|---|---|
| *H01L 21/3205* | (2006.01) |
| *H01L 21/4763* | (2006.01) |
| *H01L 21/768* | (2006.01) |
| *H01L 21/28* | (2006.01) |
| *H01L 21/3213* | (2006.01) |
| *H01L 27/11519* | (2017.01) |
| *H01L 27/11524* | (2017.01) |

(Continued)

(52) U.S. Cl.
CPC ........ *H01L 21/768* (2013.01); *H01L 21/0337* (2013.01); *H01L 21/28273* (2013.01); *H01L 21/32139* (2013.01); *H01L 27/11519* (2013.01); *H01L 27/11524* (2013.01); *H01L 27/11531* (2013.01); *H01L 21/28282* (2013.01); *H01L 27/1157* (2013.01); *H01L 27/11565* (2013.01); *H01L 27/11573* (2013.01)

(58) Field of Classification Search
CPC ................... H01L 21/76897; H01L 21/28518
USPC ........................... 438/586, 703, 618
See application file for complete search history.

(56) References Cited

U.S. PATENT DOCUMENTS

| | | |
|---|---|---|
| 7,679,133 B2 | 3/2010 | Son et al. |
| 8,163,190 B2 | 4/2012 | Moon |

(Continued)

FOREIGN PATENT DOCUMENTS

| | | |
|---|---|---|
| KR | 100995142 B1 | 11/2010 |
| KR | 20110029228 A | 3/2011 |
| KR | 20130096540 A | 8/2013 |

*Primary Examiner* — Jami M Valentine
(74) *Attorney, Agent, or Firm* — Harness, Dickey & Pierce, P.L.C.

(57) ABSTRACT

A method of fabricating a memory device includes forming an etching object layer and a lower sacrificial layer on a substrate, and forming an upper sacrificial pattern structure on the lower sacrificial layer. The upper sacrificial pattern structure includes a pad portion and a line portion on the lower sacrificial layer. An upper spacer is formed by covering a side wall of the upper sacrificial pattern structure. A lower sacrificial pattern structure including a lower sacrificial pad portion and a lower sacrificial line portion is formed by etching the lower sacrificial layer, by using the upper sacrificial pad portion and the upper spacer as a mask. A lower spacer layer is formed by covering the lower sacrificial pattern structure. A lower mask pattern including at least one line mask, bridge mask, and pad mask, is formed by etching the lower spacer layer and the lower sacrificial pattern structure.

13 Claims, 53 Drawing Sheets

(51) Int. Cl.
*H01L 27/11531* (2017.01)
*H01L 21/033* (2006.01)
 H01L 27/11565 (2017.01)
 H01L 27/1157 (2017.01)
 H01L 27/11573 (2017.01)

(56) References Cited

U.S. PATENT DOCUMENTS

| | | | |
|---|---|---|---|
| 8,247,291 B2 | 8/2012 | Min et al. | |
| 8,318,603 B2 | 11/2012 | Lee et al. | |
| 8,450,829 B2 * | 5/2013 | Fischer | H01L 21/0338 257/390 |
| 8,553,466 B2 | 10/2013 | Han et al. | |
| 8,559,235 B2 | 10/2013 | Yoon et al. | |
| 8,617,998 B2 * | 12/2013 | Min | H01L 21/0337 438/717 |
| 8,618,679 B2 | 12/2013 | Sim et al. | |
| 8,654,587 B2 | 2/2014 | Yoon et al. | |
| 8,884,377 B2 | 11/2014 | Lee et al. | |
| 9,281,179 B2 * | 3/2016 | Lee | H01L 21/02063 |
| 2005/0142497 A1 * | 6/2005 | Ryou | H01L 21/0337 430/311 |
| 2011/0233648 A1 | 9/2011 | Seol et al. | |
| 2012/0100706 A1 * | 4/2012 | Sim | H01L 27/11531 438/591 |
| 2012/0156883 A1 * | 6/2012 | Choi | H01L 21/0337 438/703 |
| 2013/0012023 A1 | 1/2013 | Park et al. | |
| 2014/0065820 A1 * | 3/2014 | Sim | H01L 21/0337 438/666 |

* cited by examiner

METHOD OF FABRICATING FLASH MEMORY DEVICE

CROSS-REFERENCE TO RELATED APPLICATION

This application claims the benefit of Korean Patent Application No. 10-2014-0108453, filed on Aug. 20, 2014, in the Korean Intellectual Property Office, the disclosure of which is incorporated herein in its entirety by reference.

BACKGROUND

The inventive concepts relate to a method of fabricating a flash memory device.

Various methods of forming patterns have been used to realize fine patterns according to the decreased design rule. In particular, in order to realize a cell array structure of a flash memory device, which is hard to realize just by light exposure equipment and light exposure techniques provided by a lithography technique, various patterning techniques have been proposed for forming a plurality of patterns which are repeatedly formed by fine pitches which exceed the limit of the lithography technique.

SUMMARY

The inventive concepts provide a method of fabricating a flash memory device, the method being capable of reducing process time and expenses and maintaining the reliability of the flash memory device.

According to an aspect of the inventive concepts, there is provided a method of fabricating a flash memory device, the method including: sequentially forming an etching object layer and a lower sacrificial layer on a substrate; forming an upper sacrificial pattern structure including an upper sacrificial pad portion and an upper sacrificial line portion on the lower sacrificial layer; forming an upper spacer covering a side wall of the upper sacrificial pattern structure; forming a lower sacrificial pattern structure including a lower sacrificial pad portion and a lower sacrificial line portion by etching the lower sacrificial layer, by using the upper sacrificial pad portion and the upper spacer as an etch mask; forming a lower spacer layer covering the lower sacrificial pattern structure; and forming a lower mask pattern including at least one line mask, at least one bridge mask, and at least one pad mask, by etching the lower spacer layer and at least a portion of the lower sacrificial pattern structure.

A line width of the at least one bridge mask may be greater than a line width of the at least one line mask.

The at least one line mask may be formed of a remaining portion of the lower spacer layer, and the at least one bridge mask may be formed of the remaining portion of the lower spacer layer and a remaining portion of the lower sacrificial pattern structure.

The method may further include forming a line pattern, a bridge pattern, and a contact pad by etching the etching object layer by using the at least one line mask, the at least one bridge mask, and the at least one pad mask, respectively, as an etch mask.

The line pattern may include a word line or a bit line.

An end of the line pattern may be connected to at least one of the bridge pattern and the contact pad.

An upper surface of the lower sacrificial line portion may have a step portion.

An upper surface of the lower sacrificial pad portion may have a step portion.

The forming of the upper spacer may include: forming an upper spacer layer covering the upper sacrificial pattern structure; forming a first photoresist pattern covering a portion of the upper spacer layer, which is located at a side wall of the upper sacrificial line portion and exposing a portion of the upper spacer layer, which is located at the other side wall of the upper sacrificial line portion facing the side wall of the upper sacrificial line portion; and forming the upper spacer layer by using the first photoresist pattern as an etch mask.

The forming of the upper spacer may include: forming an upper spacer layer on the upper sacrificial pattern structure; and removing a portion of the upper spacer layer, and the upper sacrificial line portion.

According to another aspect of the inventive concepts, there is provided a method of fabricating a flash memory device, the method including: forming a plurality of sacrificial pattern structures on an etching object layer; forming a plurality of spacers at side walls of the plurality of sacrificial pattern structures; and etching the etching object layer by using the plurality of spacers and at least one of the plurality of sacrificial pattern structures as an etch mask, wherein a length of the at least one of the plurality of sacrificial pattern structures along a first direction, which is perpendicular to an upper surface of the etching object layer, is greater than a length of each of the rest of the plurality of sacrificial pattern structures along the first direction.

The plurality of sacrificial pattern structures may have widths along a second direction, which is perpendicular to the first direction, which are equal to one another.

Each of the plurality of sacrificial pattern structures may include a first material layer pattern formed on the etching object layer and a second material layer pattern formed on the first material layer pattern.

Lengths of the first material layer patterns of the plurality of sacrificial pattern structures along the first direction may be equal to one another.

A length of the second material layer pattern of at least one of the plurality of sacrificial pattern structures along the first direction may be greater than a length of the second material layer pattern of the rest of the plurality of sacrificial pattern structures along the first direction.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts.

Example embodiments of the inventive concepts will be more clearly understood from the following detailed description taken in conjunction with the accompanying drawings in which:

FIGS. 4A through 14B are cross-sectional views and plan views for describing an order of processes of a method of fabricating a flash memory device, according to an example embodiment. FIGS. 4A, 5A, 6A, 7A, 8A, 9A, 10A, 11A, 12A, 13A, and 14A are plan views corresponding to area A of FIG. 3. FIGS. 4B, 5B, 6B, 7B, 8B, 9B, 10B, 11B, 12B, 13B, and 14B are cross-sectional views taken along lines IA1-IA1' of FIGS. 4A, 5A, 6A, 7A, 8A, 9A, 10A, 11A, 12A, 13A, and 14A, respectively.

FIGS. 15A through 24B are cross-sectional views and plan views for describing an order of processes of a method of fabricating a flash memory device, according to another example embodiment. FIGS. 15A, 16A, 17A, 18A, 19A, 20A, 21A, 22A, 23A, and 24A are plan views corresponding to area A of FIG. 3. FIGS. 15B, 16B, 17B, 18B, 19B, 20B, 21B, 22B, 23B, and 24B are cross-sectional views taken along lines IA2-IA2' of FIGS. 15A, 16A, 17A, 18A, 19A, 20A, 21A, 22A, 23A, and 24A; and FIGS. 25A through 32B are cross-sectional views and plan views for describing an order of processes of a method of fabricating a flash memory device, according to another example embodiment. FIGS. 25A, 26A, 27A, 28A, 29A, 30A, 31A, and 32A are plan views corresponding to area B of FIG. 3. FIGS. 25B, 26B, 27B, 28B, 29B, 30B, 31B, and 32B are cross-sectional vies taken along lines IB-IB' of FIGS. 25A, 26A, 27A, 28A, 29A, 30A, 31A, and 32A.

DETAILED DESCRIPTION OF EXAMPLE EMBODIMENTS

Figure 1:
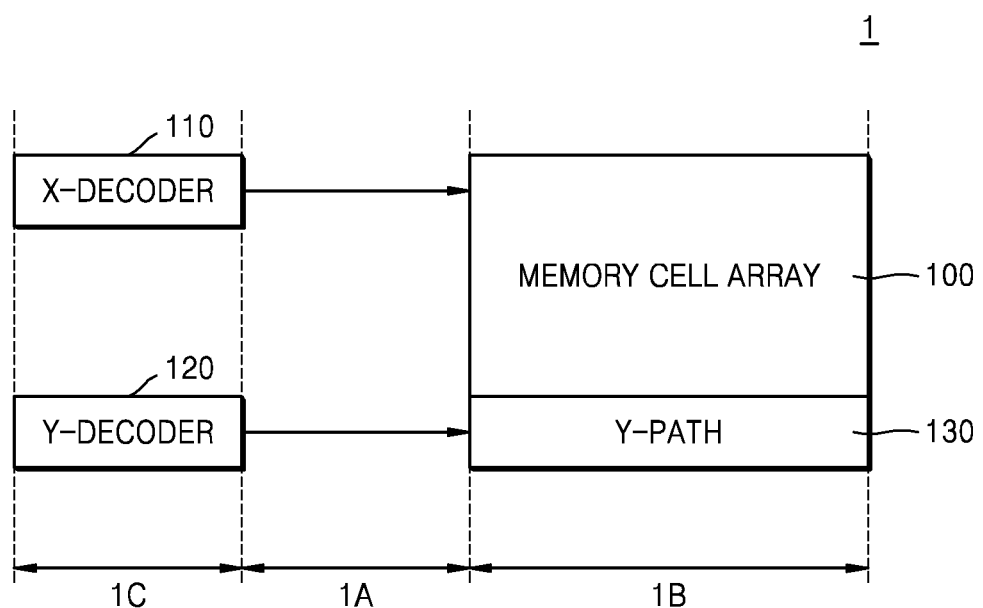
FIG. 1 is a block diagram of a flash memory device, according to an example embodiment.

Hereinafter, the inventive concepts will now be described more fully with reference to the accompanying drawings, in which example embodiments of the inventive concepts are shown. Like reference numerals in the drawings denote like elements, and a repeated explanation will not be given of overlapping features. Expressions such as "at least one of," when preceding a list of elements, modify the entire list of elements and do not modify the individual elements of the list.

These inventive concepts may, however, be embodied in different forms and should not be construed as limited to the example embodiments set forth herein. Rather, these example embodiments are provided so that this disclosure is thorough and complete and fully conveys the inventive concepts to those skilled in the art.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments. For example, a first element could be termed a second element, and, similarly, a second element could be termed a first element, without departing from the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an example embodiment may be implemented differently, a specific process order may be performed differently from the described order. For example, two consecutively described processes may be performed substantially at the same time or performed in an order opposite to the described order.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the drawings, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram of a flash memory device 1 according to an example embodiment.

Figure 2:
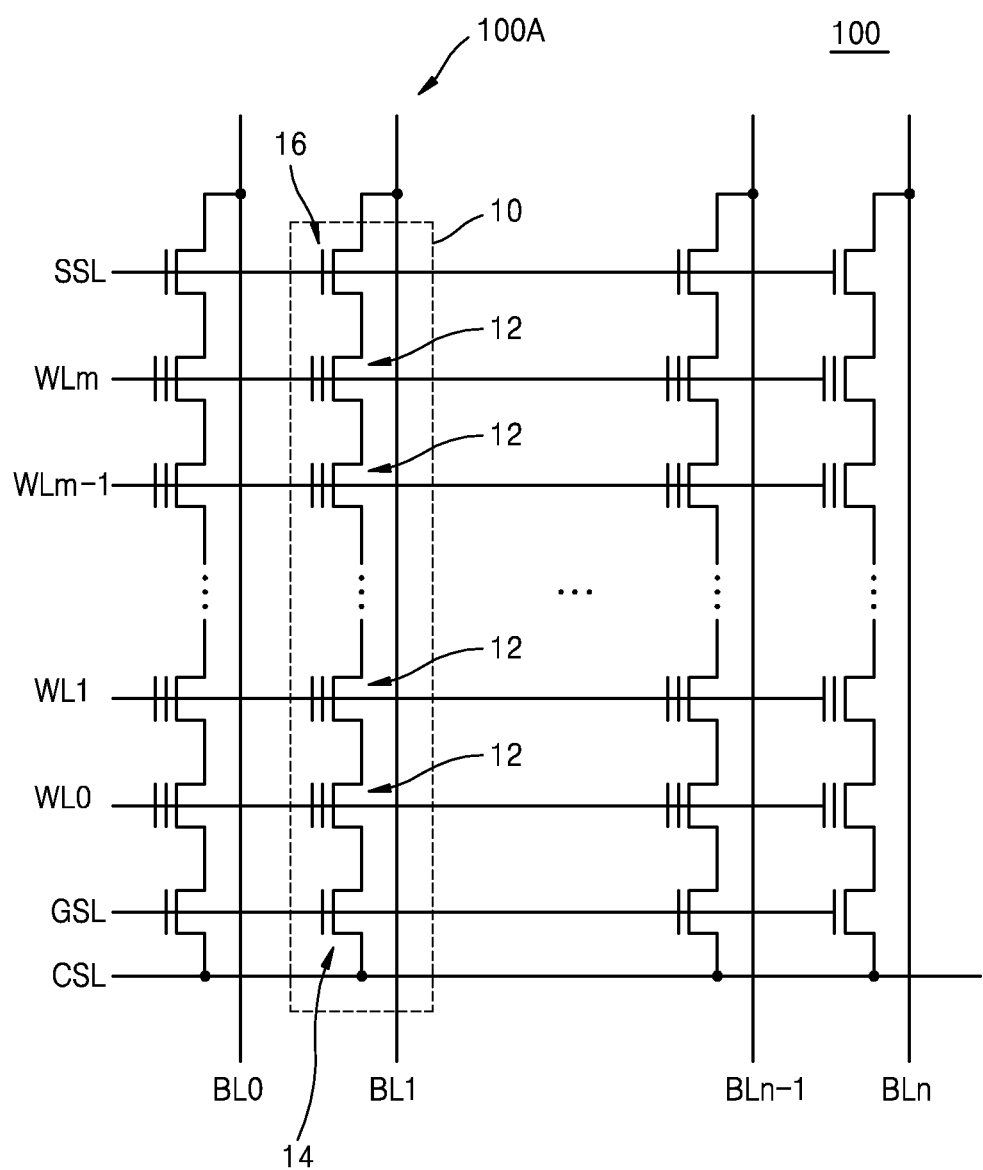
FIG. 2 is a circuit diagram of a memory cell array of the flash memory device of FIG. 1.

FIG. 2 is a circuit diagram of a memory cell array 100 of the flash memory device 1.

Referring to FIGS. 1 and 2, the flash memory device 1 may include a cell area 1B in which the memory cell array 100 is located, an ambient area 1C in which an X-decoder 110 and a Y-decoder 120 are located, and a connection area 1A which connects the cell area 1B and the ambient area 1C.

The memory cell array 100 includes a plurality of memory cell blocks 100A formed of a plurality of memory cells.

The plurality of memory cell blocks 100A include a plurality of cell strings 10 formed between bit lines BL0, BL1, . . . BLn-1, and BLn and a common source line CSL. Each of the plurality of cell strings 10 includes a plurality of memory cells 12 connected in series. A gate electrode of each of the plurality of memory cells 12 included in each cell string 10, is connected with a word line $WL_0$, $WL_1$ . . . $WL_{m-1}$, or $WL_m$. A ground selection transistor 14, connected with a ground selection line GSL, and a string selection transistor 16, connected with a string selection line SSL, are respectively arranged at two ends of the cell string 10. The ground selection transistor 14 and the string selection transistor 16 control an electrical connection among the plurality of memory cells 12, the bit lines $BL_0$, $BL_1$, . . . , $BL_{n-1}$, and $BL_n$ and the common source line CSL. The memory cells 12 connected to the word lines $WL_0$, $WL_1$, . . . , $WL_{m-1}$, and $WL_m$ through the plurality of cell strings 10, respectively, form a page unit or a byte unit.

In the memory cell array 100, the X-decoder 110 for selecting the word lines $WL_0$, $WL_1$, . . . , $WL_{m-1}$, and $WL_m$ of the memory cell block 100A and the Y-decoder 120 for selecting the bit lines $BL_0$, $BL_1$, . . . , $BL_{n-1}$, and $BL_n$ of the memory cell block 100A are connected with each other. A Y-gating 130 may be connected to the Y-decoder 120 to designate a bit line path in the memory cell array 100.

Figure 3:
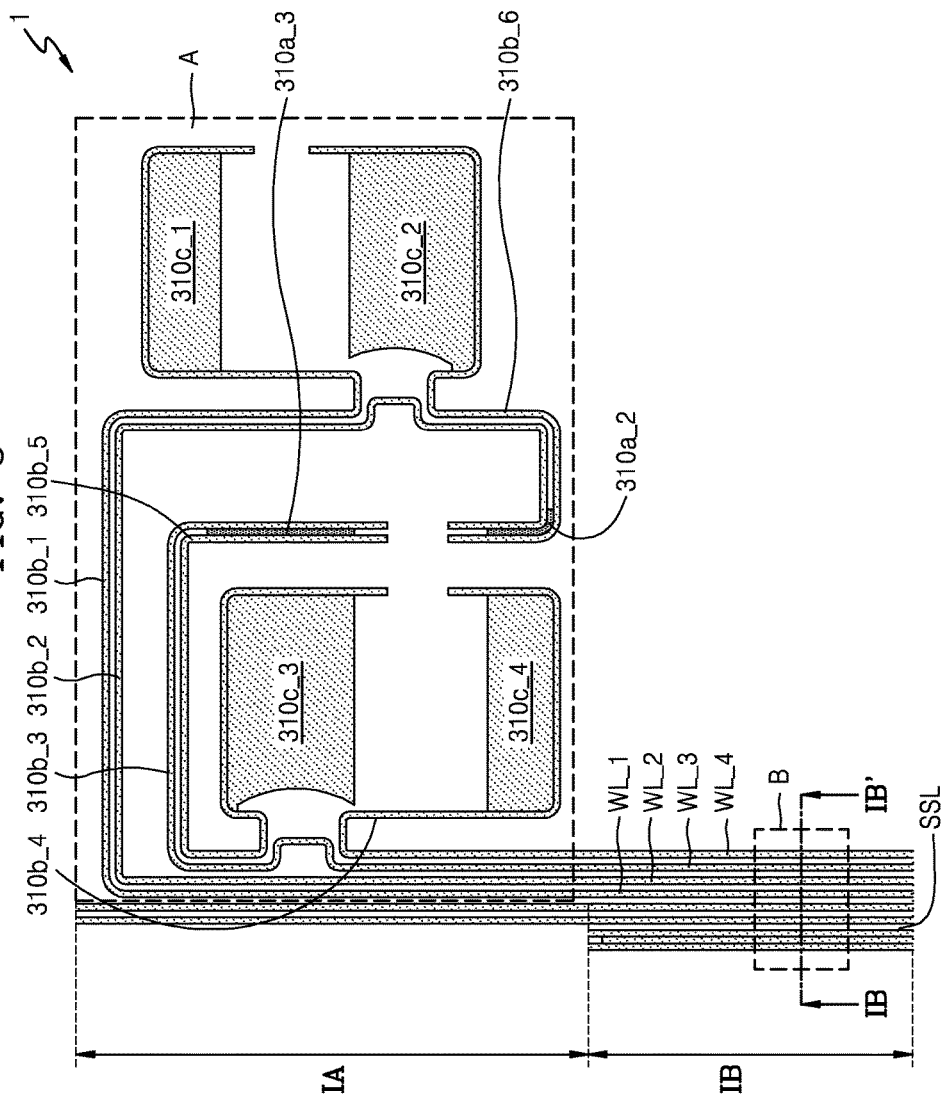
FIG. 3 is a plan view of a partial structure of a cell area and a connection area of the flash memory device of FIG. 1.

FIG. 3 is a plan view of a partial structure of the connection area 1A and the cell area 1B of the flash memory device 1.

Referring to FIG. 3, the flash memory device 1 may include a pattern structure which includes a plurality of line patterns 310b_1, 310b_2, 310b_3, 310b_4, 310b_5, and 310b_6, bridge patterns 310a_2 and 310a_3, and contact pads 310c_1, 310c_2, 310c_3, and 310c_4 formed in the connection area 1A, and a string selection line SSL and a plurality of word lines WL_1, WL_2, WL_3, and WL_4 formed in the cell area 1B.

In some example embodiments, the pattern structure 310 formed in the connection area 1A may be connected to bit lines (not shown) formed in the cell area 1B, unlike the present example embodiment.

The flash memory device 1 according to the present example embodiment includes the four word lines WL_1, WL_2, WL_3, and WL_4 and the four contact pads 310c_1, 310c_2, 310c_3, and 310c_4. However, the number of word lines and the number of contact pads are not limited thereto.

Also, although the line patterns 310b_1, 310b_2, 310b_3, 310b_4, 310b_5, and 310b_6 and the word lines WL_1, WL_2, WL_3, and WL_4 are described as separate elements, each of the word lines WL_1, WL_2, WL_3, and WL_4 may be part of the line patterns 310b_1, 310b_2, 310b_3, 310b_4.

The plurality of contact pads 310c_1, 310c_2, 310c_3, and 310c_4 for connecting the word lines WL_1, WL_2, WL_3, and WL_4 in the cell area 1B with the X-decoder 110 (refer to FIG. 1) in the ambient area 1C are formed in the connection area 1A.

The plurality of line patterns 310b_1, 310b_2, 310b_3, 310b_4, 310b_5, and 310b_6 and the bridge patterns 310a_2 and 310a_3 may function to connect the word lines WL_1, WL_2, WL_3, and WL_4 and the contact pads 310c_1, 310c_2, 310c_3, and 310c_4.

In detail, ends of the line patterns 310b_1 and 310b_4 are connected to the word lines WL_1 and WL_4, respectively, and the other ends of the line patterns 310_1 and 310b_4 are connected to the contact pads 310c_1 and 310c_4, respectively. Ends of the line patterns 310b_2 and 310b_3 are connected to the word lines WL_2 and WL_3, respectively, and the other ends of the line patterns 310b_2 and 310b_3 are connected to the contact pads 310c_1 and 310c_4, respectively, through the bridge patterns 310a_2 and 310a_3. Ends of the line patterns 310b_5 and 310b_6 are connected to the bridge patterns 310a_3 and 310a_2 respectively, and the other ends of the line patterns 310b_5 and 310b_6 are connected to the contact pads 310c_3 and 310c_2, respectively.

FIGS. 4A through 14B are cross-sectional views and plan views for describing an order of processes of a method of fabricating a flash memory device, according to an example embodiment. FIGS. As of FIGS. 4A through 14B (FIG. 4A, FIG. 5A, FIG. 6A, FIG. 7A, FIG. 8A, FIG. 9A, FIG. 10A, FIG. 11A, FIG. 12A, FIG. 13A, FIG. 14A) are plan views corresponding to area A of FIG. 3. FIGS. Bs of FIGS. 4A through 14B (FIG. 4B, FIG. 5B, FIG. 6B, FIG. 7B, FIG. 8B, FIG. 9B, FIG. 10B, FIG. 11B, FIG. 12B, FIG. 13B, FIG. 14B) are cross-sectional views taken along lines IA1-IA1' of FIGS. As.

Figure 4A:
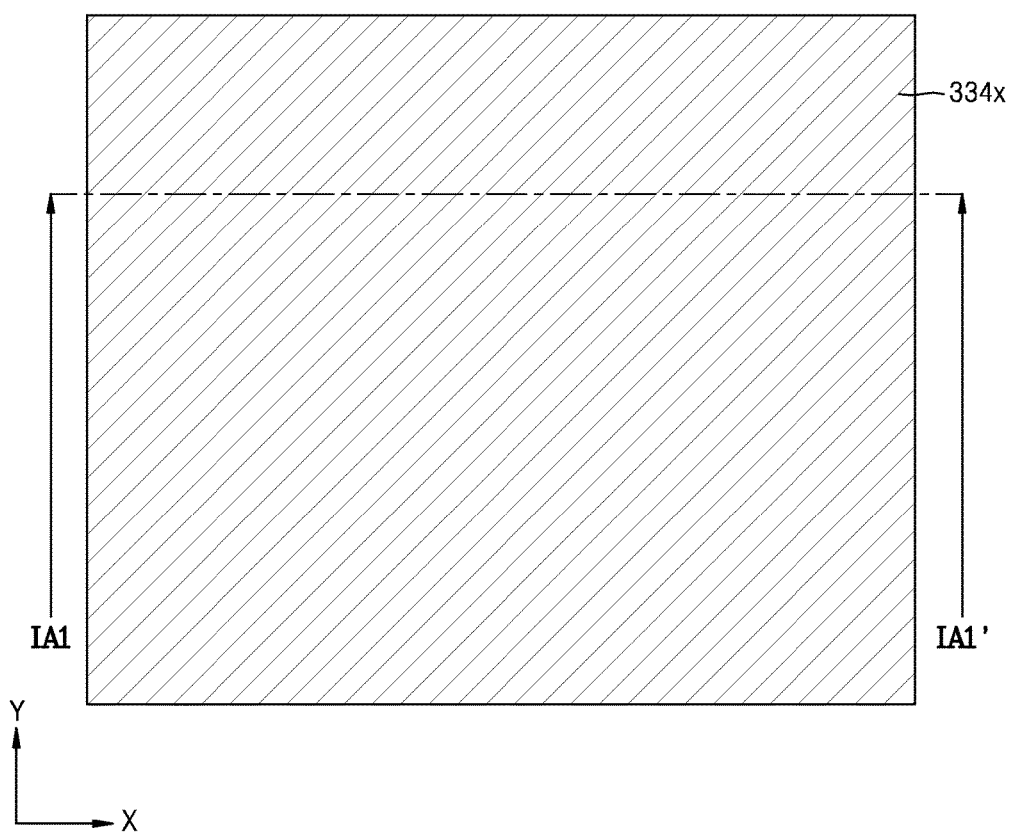
Figure 4B:
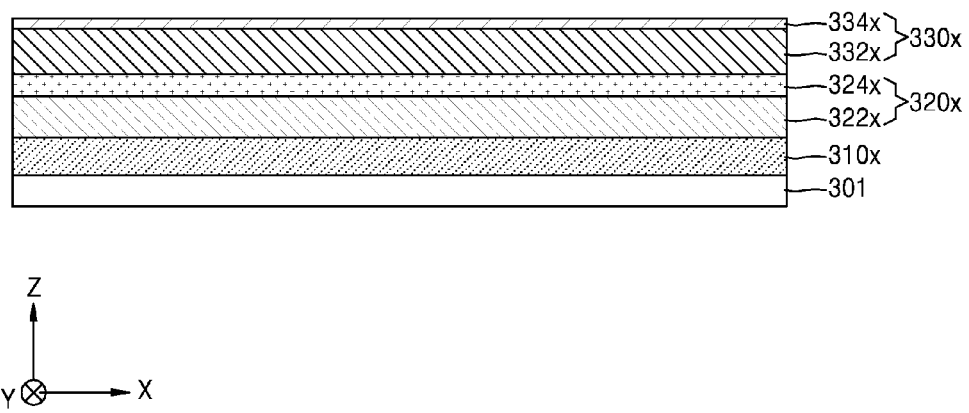

Referring to FIGS. 4A and 4B, an etching object layer 310x is formed on a substrate 301. Although not illustrated, the etching object layer 310x may include a conductive layer having a single- or double-layered structure.

As illustrated in FIG. 3, when the line patterns 310b_1, 310b_2, 310b_3, 310b_4 include word lines WL_1, WL_2, WL_3, and WL_4, the etching object layer 310x may be a stack of a tunneling insulating layer, a charge storage layer, a blocking insulating layer, and a gate conductive layer, which are sequentially formed on the substrate 301. The tunneling insulating layer, the charge storage layer, the blocking insulating layer, and the gate conductive layer will be described in detail later with reference to FIGS. 25A and 25B.

In some example embodiments, when the line patterns 310_1, 310b_2, 310b_3, 310b_4 include bit lines, the etching object layer 310x may be formed of doped polysilicon or metal layer.

A lower sacrificial layer 320x and an upper sacrificial layer 330x are sequentially formed on the etching object layer 310x.

Some portions of the upper sacrificial layer 330x and the lower sacrificial layer 320x may be provided as buffer layers for forming etch masks having a small line width and a great line width, respectively.

The lower sacrificial layer 320x may be formed by sequentially depositing a first lower material layer 322x and a second lower material layer 324x, and the upper sacrificial layer 330x may be formed by sequentially depositing a first upper material layer 332x and a second upper material layer 334x.

In some example embodiments, each of the first lower material layer 322x and the first upper material layer 332x may be formed of a polymer material, which may be easily removed by an ashing or strip process. For example, each of the first lower material layer 322x and the first upper material layer 332x may be formed as a spin-on hard mask (SOH) layer or a carbon spin-on hard mask (C-SOH) layer.

The second lower material layer 324x and the second upper material layer 334x may be formed of materials having an etch selectivity with respect to the first lower material layer 322x and the first upper material layer 332x, respectively. In some example embodiments, each of the second lower material layer 324x and the second upper material layer 334x may be formed by depositing silicon nitride or silicon oxynitride.

The first upper material layer 332x may be used as a substantial etch mask in an etching process of the lower sacrificial layer 320x. The second upper material layer 334x may not be used as the etch mask in the etching process and may be completely removed before the etching process. Accordingly, the first upper material layer 332x may have a sufficient thickness to be used as the etch mask and the second upper material layer 334x may have a relatively smaller thickness than the first upper material layer 332x.

Similarly, the first lower material layer 322x may be used as a substantial etch mask in an etching process of the etching object layer 310x. The second lower material layer 324x may not be used as the etch mask in the etching process and may be completely removed before the etching process. Accordingly, the first lower material layer 322x may have a sufficient thickness to be used as the etch mask and the second lower material layer 324x may have a relatively smaller thickness than the first lower material layer 322x.

Figure 5A:
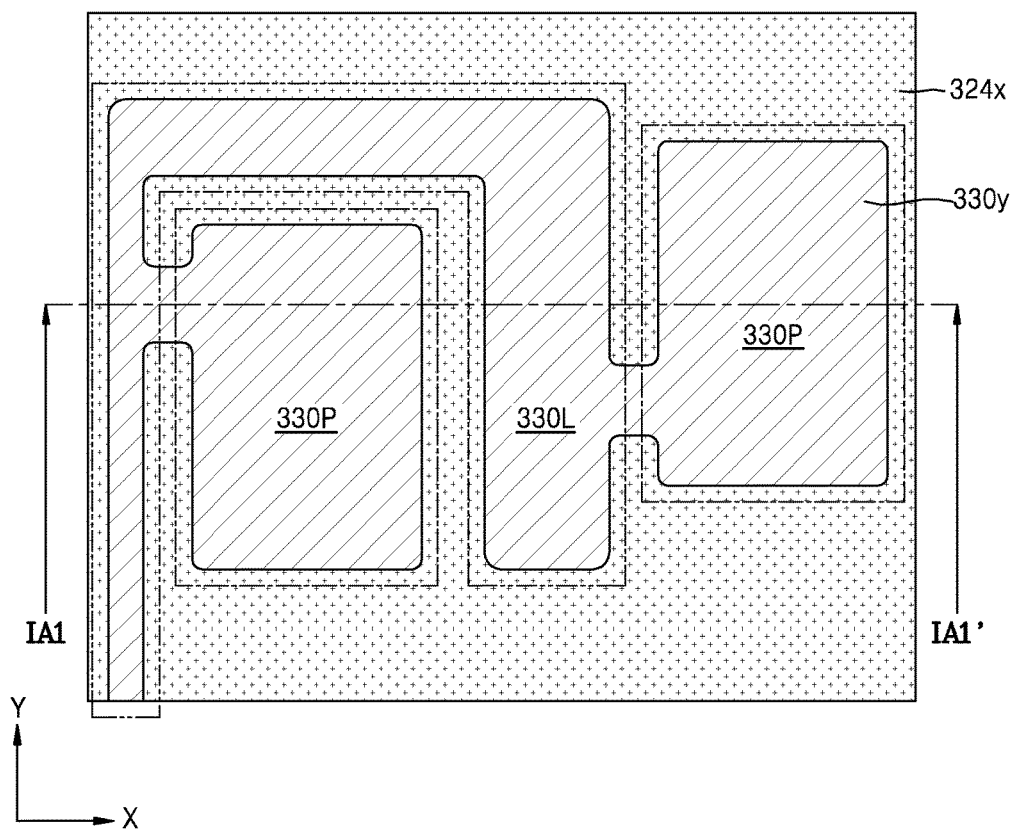
Figure 5B:
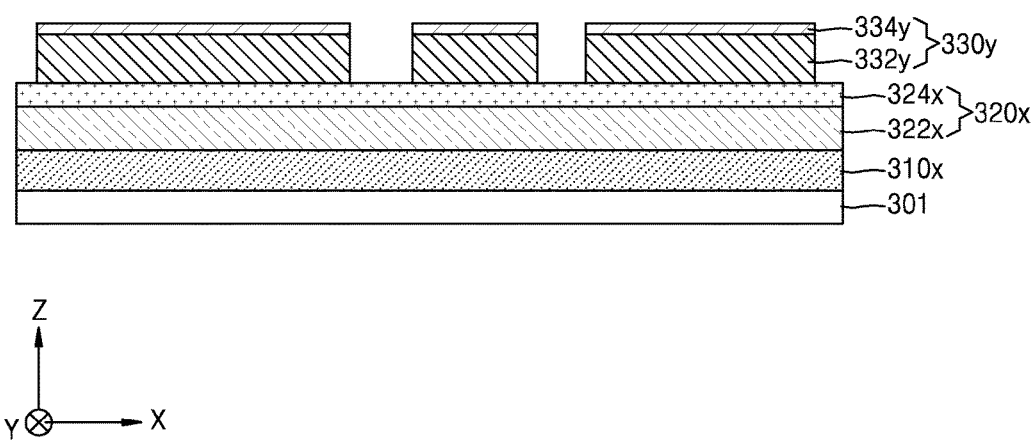

Referring to FIGS. 5A and 5B, an upper sacrificial pattern structure 330y is formed by patterning the upper sacrificial layer 330x by a photolithography process.

The upper sacrificial pattern structure 330y may include a first upper material layer pattern 332y, which is formed by patterning the first upper material layer 332x, and a second upper material layer pattern 334y, which is formed by patterning the second upper material layer 334x.

According to shapes of the upper sacrificial pattern structure 330y, shapes of an etch mask, which is to be formed later, may vary. Thus, the upper sacrificial pattern structure 330y has to be formed in different shapes depending on the shapes of a desired pattern structure.

Figure 14A:
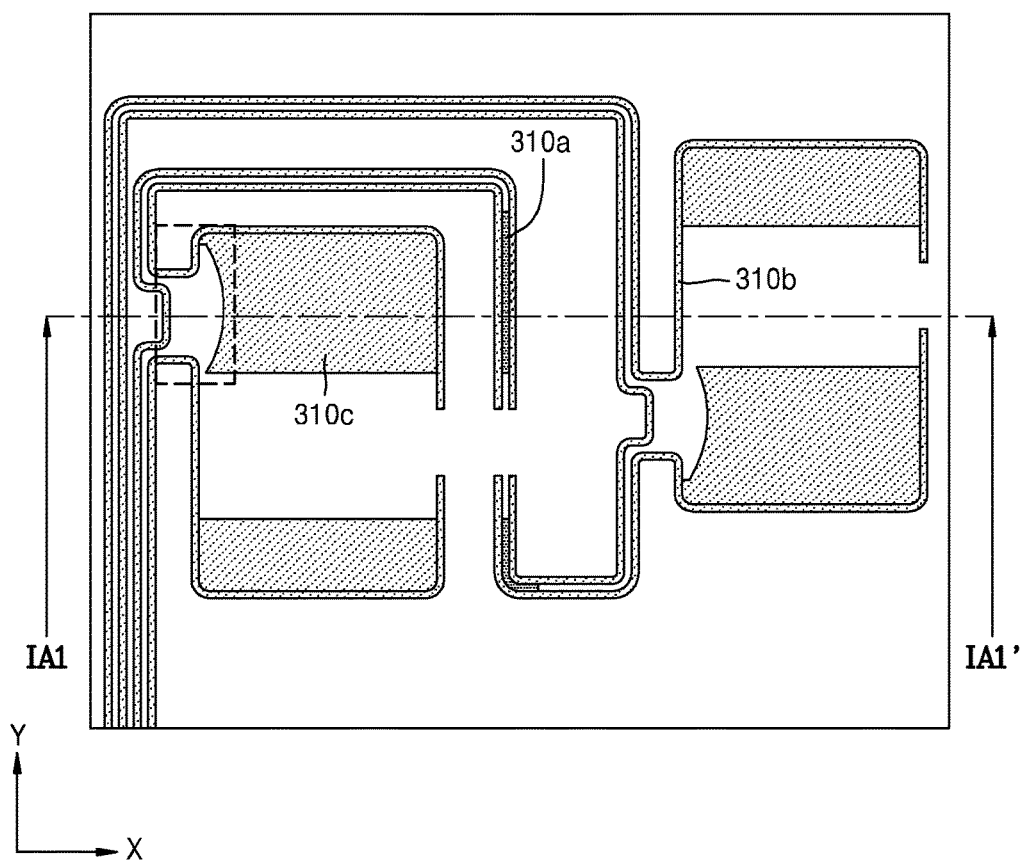
Figure 14B:
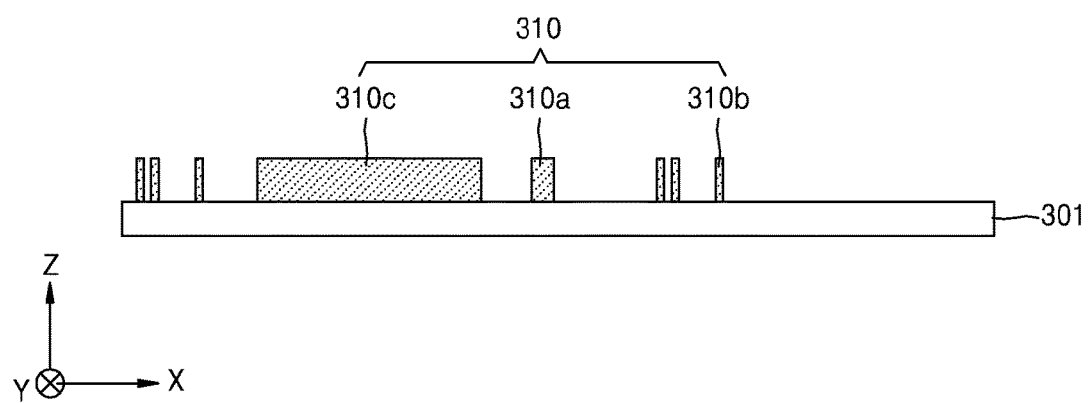

For example, the upper sacrificial pattern structure 330y may include an upper sacrificial line portion 330L, in which a bridge pattern 310a and a line pattern 310b, which will be described later with reference to FIGS. 14A and 14B, are located, and an upper sacrificial pad portion 330P, in which a contact pad 310c is located. A portion of the upper sacrificial line portion 330L may be connected with the upper sacrificial pad portion 330P.

Figure 6A:
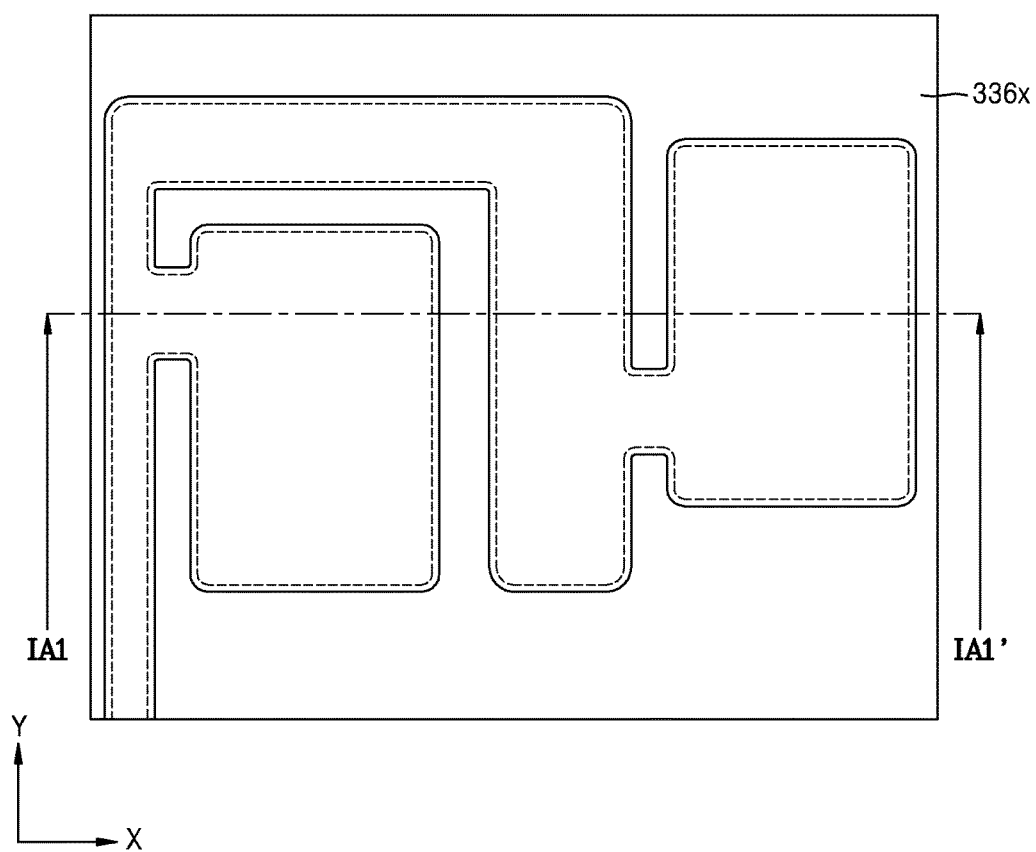
Figure 6B:
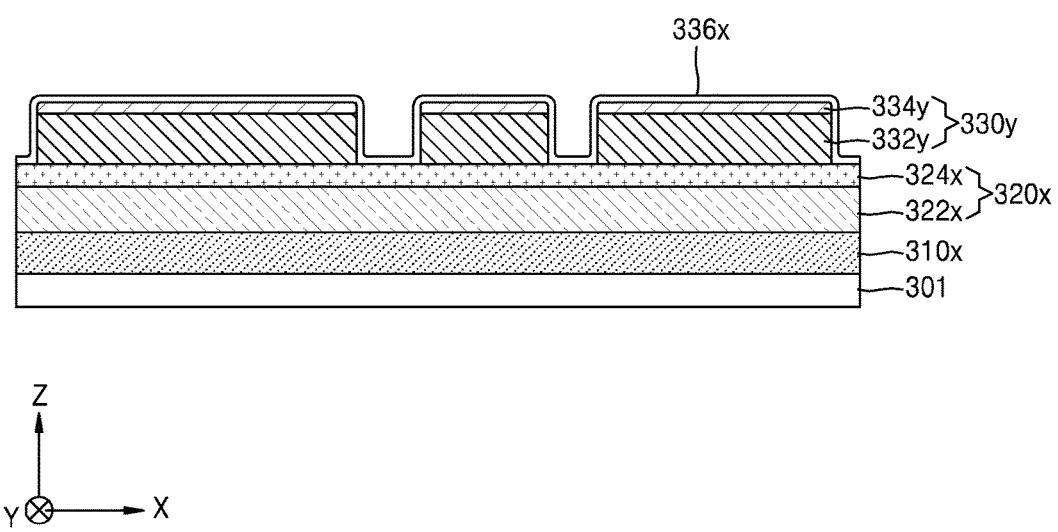

Referring to FIGS. 6A and 6B, an upper spacer layer 336x is formed and covers side walls and an upper surface of the upper sacrificial pattern structure 330y on the lower sacrificial layer 320x.

In some example embodiments, the upper spacer layer 336x may be formed of a material having a high etch selectivity with respect to the upper sacrificial pattern structure 330y. The upper spacer layer 336x may be formed, for example, by depositing silicon oxide.

Figure 9A:
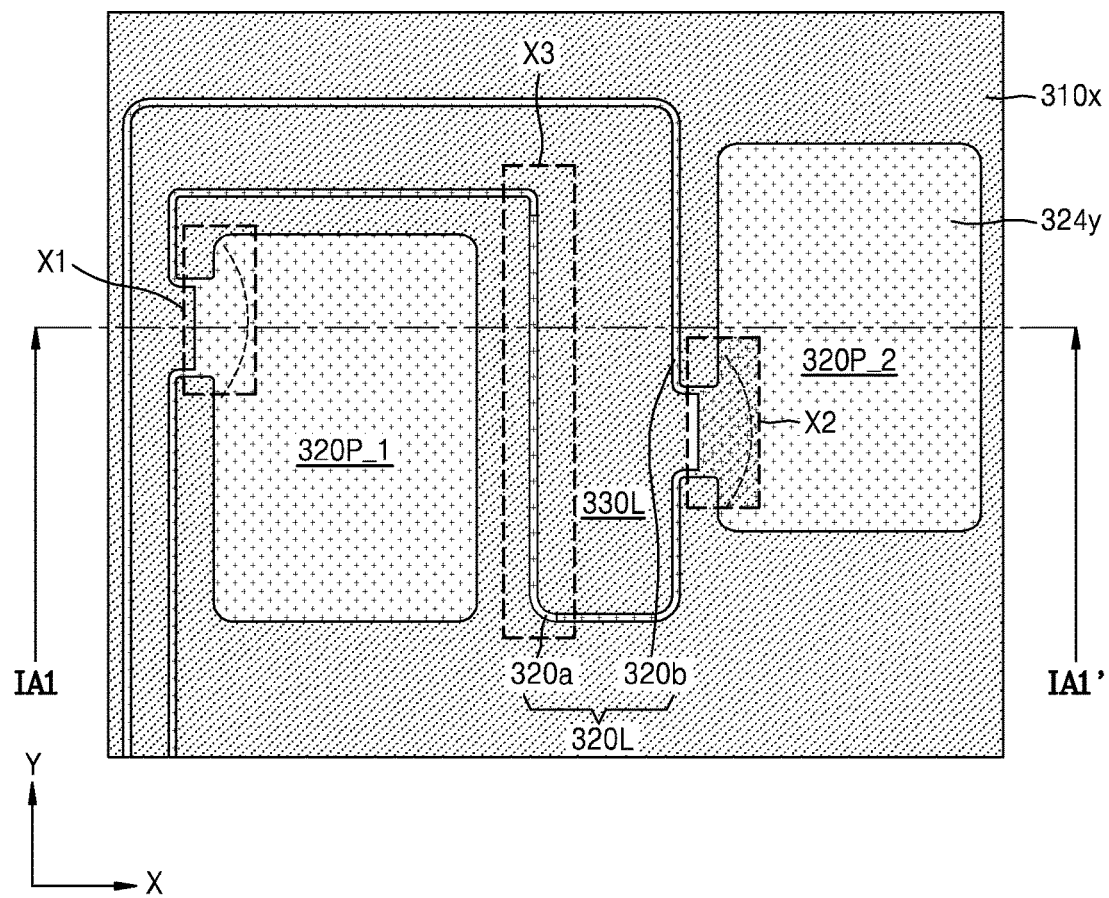
Figure 9B:
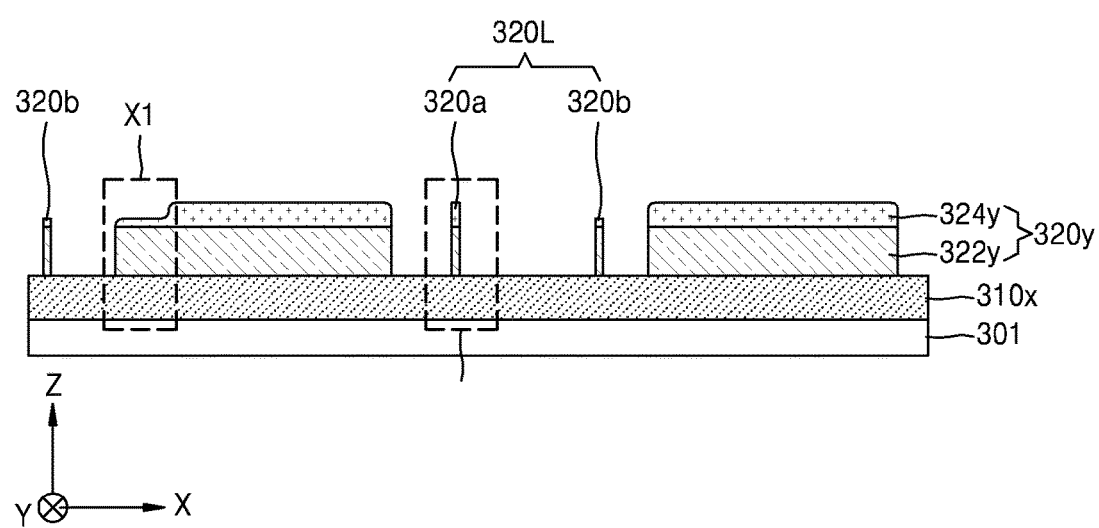

In some example embodiments, a portion of the upper spacer layer 336x may function as an etch mask for forming a lower sacrificial line portion 320L (refer to FIGS. 9A and 9B). Thus, the upper spacer layer 336x may be formed in a thickness that is the same as a line width of the lower sacrificial line portion 320L, which is to be formed.

The upper spacer layer 336x may have a thickness that is smaller than a marginal line width which may be formed by a photo process. To this end, the upper spacer layer 336x may be deposited by an atomic layer deposition process.

Figure 7A:
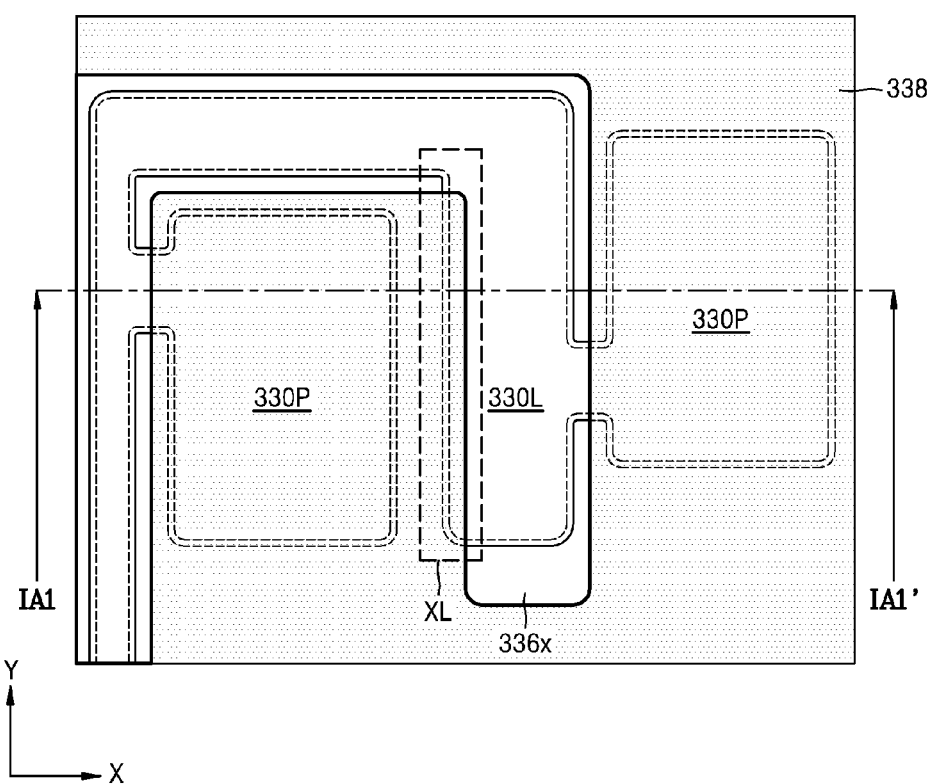
Figure 7B:
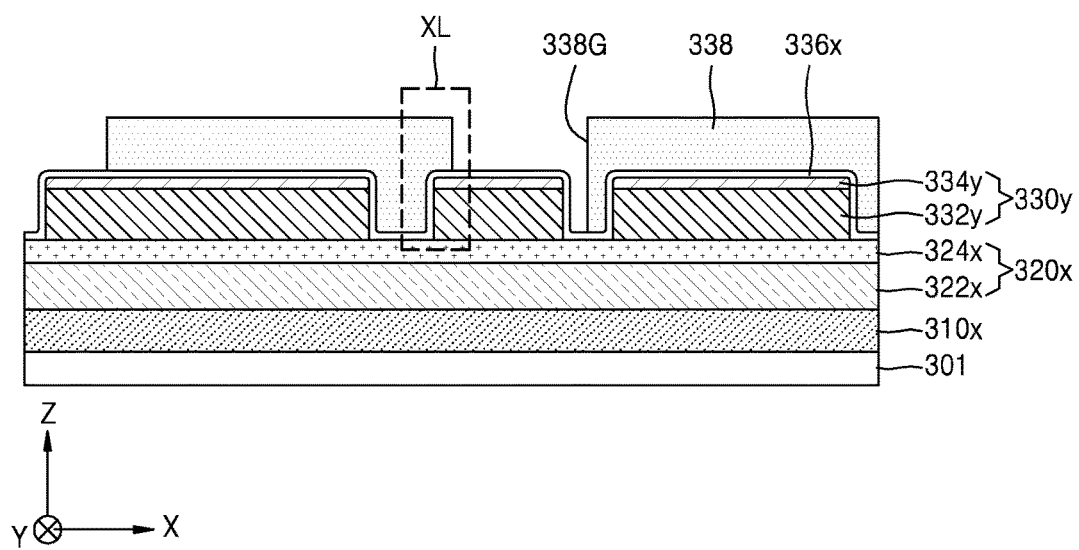

Referring to FIGS. 7A and 7B, a first photoresist pattern 338 is formed by coating the upper spacer layer 336x with a photoresist layer (not shown) and then performing a photo process.

The first photoresist pattern 338 includes an opening 338G exposing at least a portion of the upper spacer layer 336x.

In detail, the opening 338G of the first photoresist pattern 338 may expose the upper spacer layer 336x in an area in which the upper sacrificial line portion 330L is located and not expose the upper spacer layer 336x in at least an area XL of the upper sacrificial line portion 330L. The bridge patterns 310a_2 and 310a_3 described with reference to FIG. 3 are formed in the area XL of the upper sacrificial line portion 330L by a sequential process.

Figure 8A:
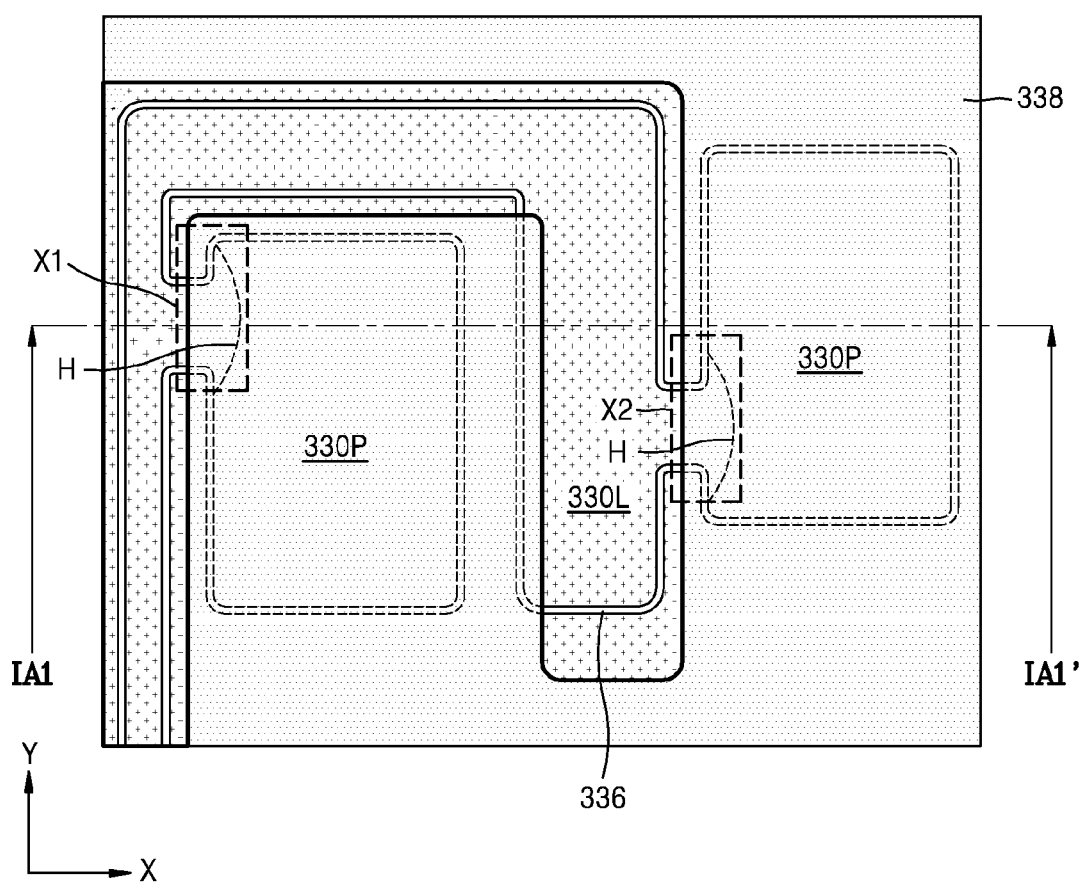
Figure 8B:
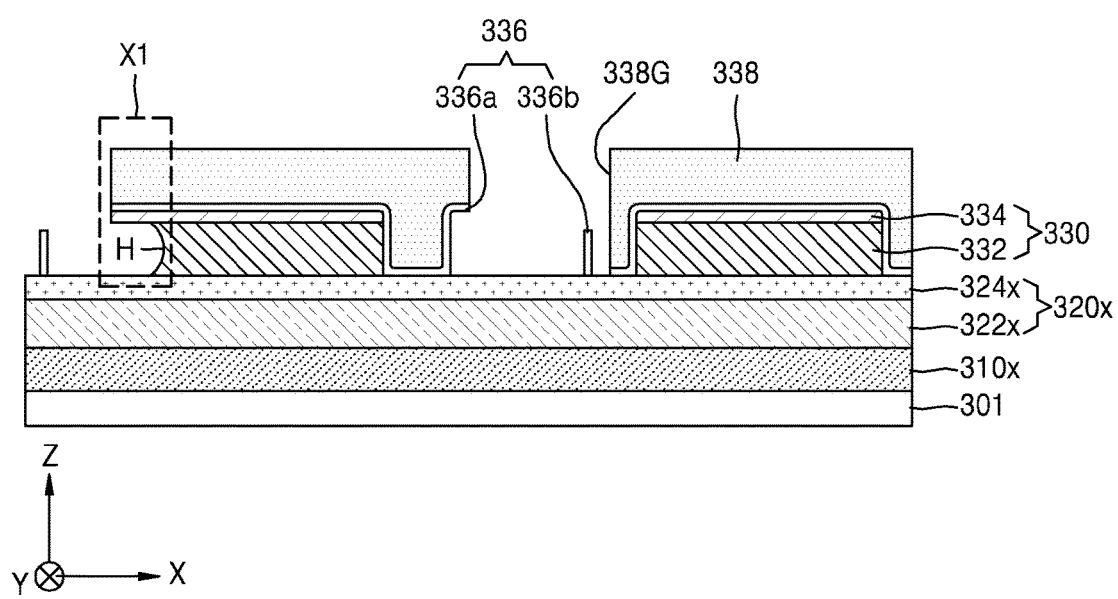

Referring to FIGS. 8A and 8B, an upper spacer layer 336 is formed by etching the upper spacer layer 336x located in the opening 338G by using the first photoresist pattern 338 as an etch mask. The upper spacer layer 336 that remains after the etching process includes upper spacers 336a and 336b.

The etching of the upper spacer layer 336x may be performed by using, for example, an etch gas for silicon oxide. In some example embodiments, the etching of the upper spacer layer 336x may be performed by an anisotropic etching process.

In some example embodiments, portions of the first upper material layer pattern 332y and the second upper material layer pattern 334y, which are located in the opening 338G, may be etched during the etching of the upper spacer layer 336x. In example embodiments, the first upper material layer pattern 332y and the second upper material layer pattern 334y that are located in the opening 338G may be completely etched during the etching of the upper spacer layer 336x.

The upper spacer 336a is covered by the first photoresist pattern 338 during the etching process. Unlike this, the upper spacer 336b is exposed through the opening 338G of the first photoresist pattern 338, and thus, a portion of the upper spacer 336b is removed by the etching process. For example, a length of the upper spacer 336b along a third direction (a Z axis direction) becomes less than a length of the upper spacer 336a along the third direction (the Z axis direction).

An upper sacrificial pattern structure 330 is formed by removing a portion of the upper sacrificial pattern structure 330y, the portion being exposed through the opening 338G, after forming the upper spacers 336a and 336b. The removing of the portion of the upper sacrificial pattern structure 330y may be performed by an anisotropic etching process, an isotropic etching process, or an ashing or strip process.

When at least one of the first upper material layer pattern 332 and the second upper material layer pattern 334 in an area exposed through the opening 338G is removed by an isotropic etching process, a material layer pattern in areas X1 and X2 which is covered by the first photoresist pattern 338 may also be partially removed. For example, a groove H may be formed at a lower side portion of the opening 338G adjacent to the upper sacrificial pad portion 330P.

In some example embodiments, the removing of the at least one of the first upper material layer pattern 332 and the second upper material layer pattern 334 may be performed in an in-situ method with the etching of the upper spacer layer 336x. For example, after etching the upper spacer layer 336x by using an etch gas for silicon oxide, the second upper material layer pattern 334 may be etched by using an etch gas for silicon nitride, and a portion of the first upper material layer pattern 332 may be removed by an ashing or strip process.

Between the forming of the upper spacers 336a and 336b and the forming of the upper sacrificial pattern structure 330, the first photoresist pattern 338 may be removed. The removing of the first photoresist pattern 338 may be performed, for example, by an ashing or strip process.

In some example embodiments, during the removing of the first photoresist pattern 338, the first upper material layer pattern 332 in the area exposed through the opening 338G may be also removed. In this case, the first upper material layer pattern 332 may be formed of an organic polymer material having a similar etching characteristic as the first photoresist pattern 338. Also, since the first photoresist pattern 338 is removed isotropically, the first upper material layer pattern 332 in the areas X1 and X2 which is covered by the first photoresist pattern 338 may also be partially removed.

Referring to FIGS. 9A and 9B, after the first photoresist pattern 338 is removed, a lower sacrificial structure 320y is formed by etching the lower sacrificial layer 320x by using the upper sacrificial pattern structure 330 and the upper spacers 336a and 336b as etch masks. The lower sacrificial structure 320y may include lower sacrificial pad portions 320P_1 and 320P_2 and the lower sacrificial line portion 320L.

In some example embodiments, each of the lower sacrificial pad portions 320P_1 and 320P_2 and the lower sacrificial line portion 320L may be a stack of a first lower material layer pattern 322y and a second lower material layer pattern 324y that are sequentially formed.

Here, an upper surface of each of the lower sacrificial pad portions 320P_1 and 320P_2 may have a step portion. For example, the upper surface of each of the lower sacrificial pad portions 320P_1 and 320P_2 in the areas X1 and X2 may have a lower level than the upper surface of each of the lower sacrificial pad portions 320P_1 and 320P_2 in other areas. This is because a height of the upper sacrificial pattern structure 330 (refer to FIG. 8B) in the areas X1 and X2 serving as an etch mask, along the third direction (the Z axis direction), is shorter than a length of the upper sacrificial pattern structure 330 in other areas than the areas X1 and X2 along the third direction (the Z axis direction), due to the groove H (refer to FIG. 8B) formed in the areas X1 and X2.

An upper surface of the lower sacrificial line portion 320L may also have a step portion. For example, the upper surface of the lower sacrificial line portion 320a (refer to FIG. 8B) in an area X3 may be higher than the upper surface of the lower sacrificial line portion 320b (refer to FIG. 8B) in other areas than the area X3. This is because a length of the upper spacer 336a in the area X3 serving as an etch mask, along the third direction (the Z axis direction), is longer than a length of the upper spacer 336b in other areas than the area X3 along the third direction (the Z axis direction).

In example embodiments, the lower sacrificial line portion 320b, and the lower sacrificial pad portions 320P_1 and 320P_2 in the areas X1 and X2 may be formed of only the first lower material layer pattern 322y. For example, the lower sacrificial line portion 320b, and the second lower material layer pattern 324y in the areas X1 and X2 may be completely etched in the process of forming the lower sacrificial structure 320y.

Figure 10A:
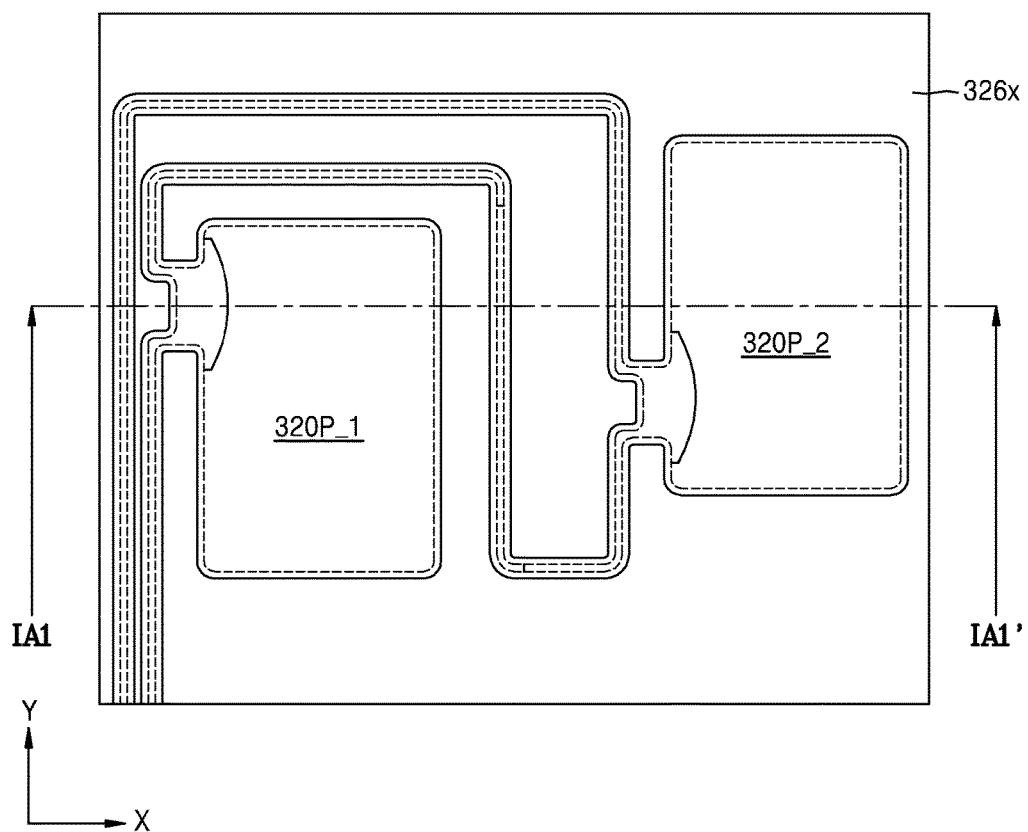
Figure 10B:
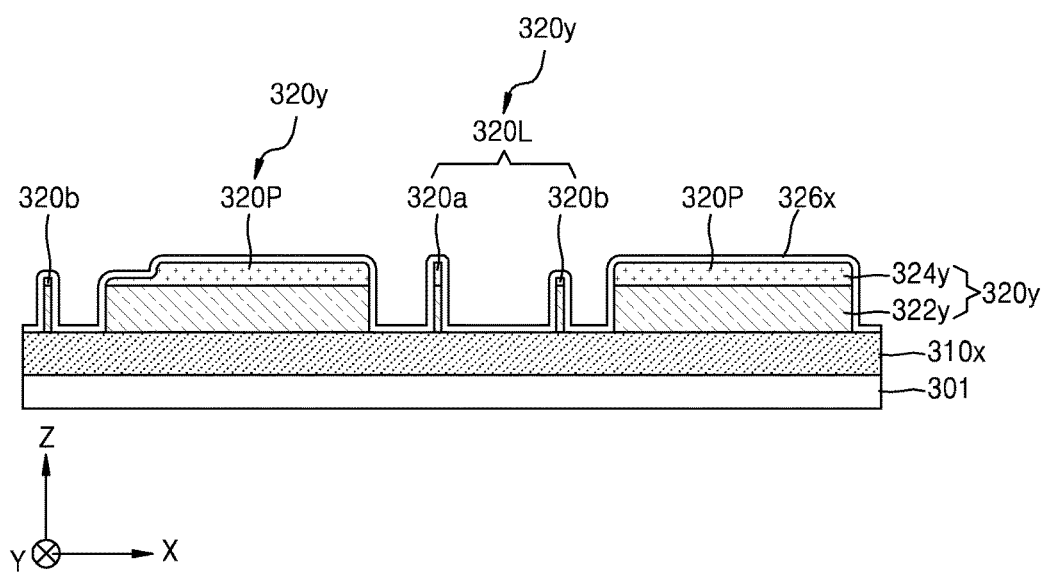

Referring to FIGS. 10A and 10B, a lower spacer layer 326x is formed and covers side walls and an upper surface of the lower sacrificial pattern structure 320y on the etching object layer 310x.

In some example embodiments, the lower spacer layer 326x may be formed of a material having a high etch selectivity with respect to the lower sacrificial pattern structure 320y. The lower spacer layer 326x may be formed, for example, by depositing silicon oxide.

In some example embodiments, a portion of the lower spacer layer 326x may function as an etch mask for forming the plurality of line patterns 310b_1, 310b_2, 310b_3, 310b_4, 310b_5, and 310b_6 (refer to FIG. 3). Accordingly, the lower spacer layer 326x may be formed in a thickness that is the same as a line width of the line pattern 310b which is to be formed.

The lower spacer layer 326x may have a thickness that is smaller than a marginal line width which may be formed by a photo process. To this end, the lower spacer layer 326x may be deposited by an atomic layer deposition process.

Figure 11A:
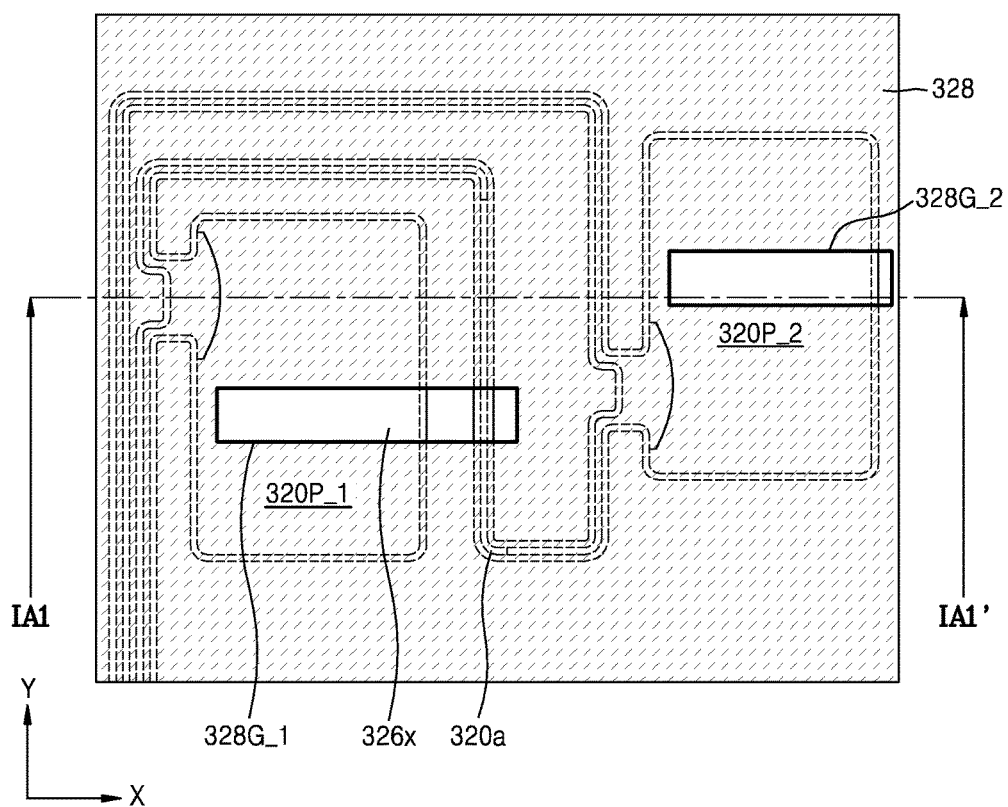
Figure 11B:
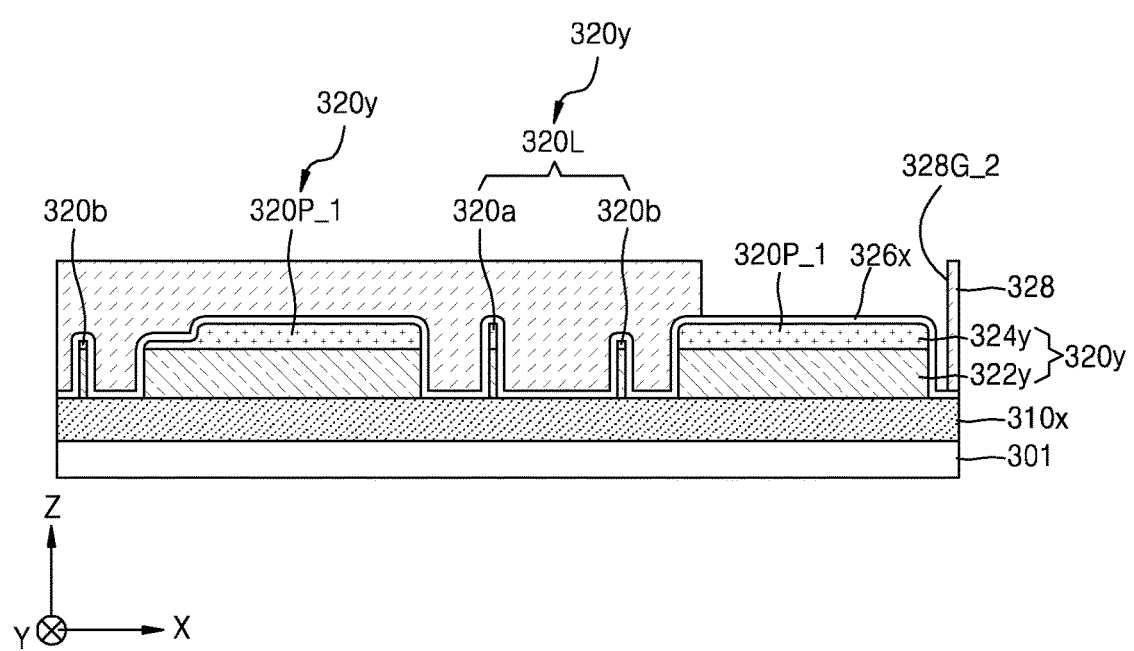

Referring to FIGS. 11A and 11B, after the lower spacer layer 326x is coated with a photoresist layer (not shown), a photo process is performed to form a second photoresist pattern 328. The second photoresist pattern 328 includes openings 328G_1 and 328G_2 exposing at least a portion of the lower spacer layer 326x.

The opening 328G_1 of the second photoresist pattern 328 may be formed such that the opening 328G_1 exposes a portion of the lower sacrificial pad portion 320P_1 and the lower spacer layer 326x on a portion of the lower sacrificial line portion 320a. The opening 328G_2 may be formed such that the opening 328G_2 exposes the lower spacer layer 326x in an area of the lower sacrificial pad portion 320P_2.

Figure 12A:
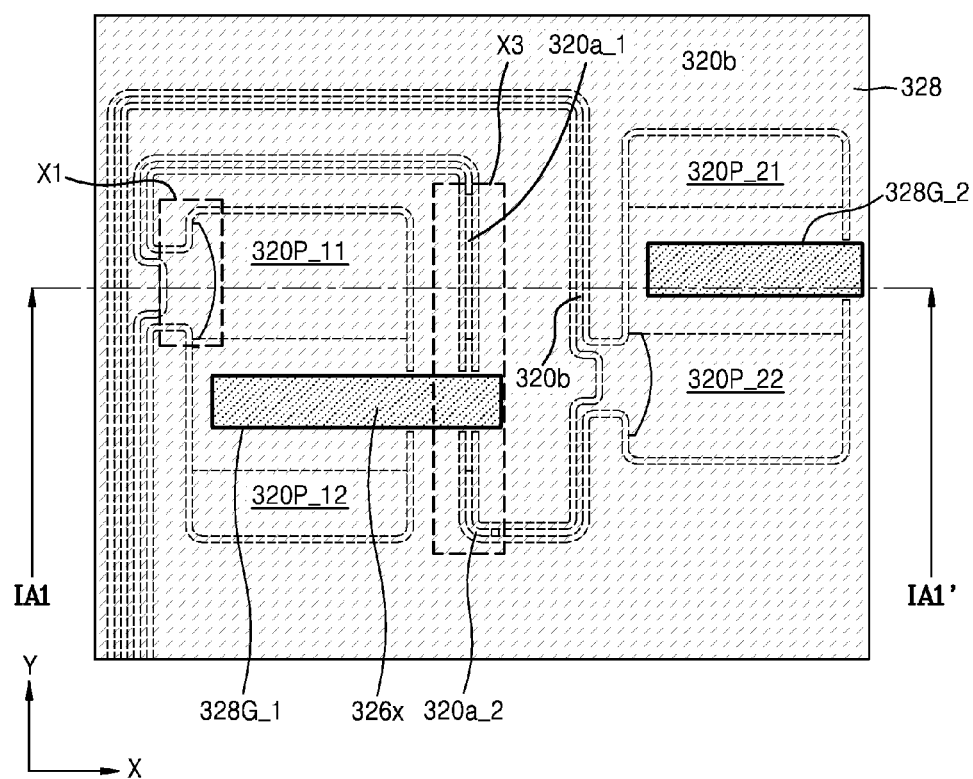
Figure 12B:
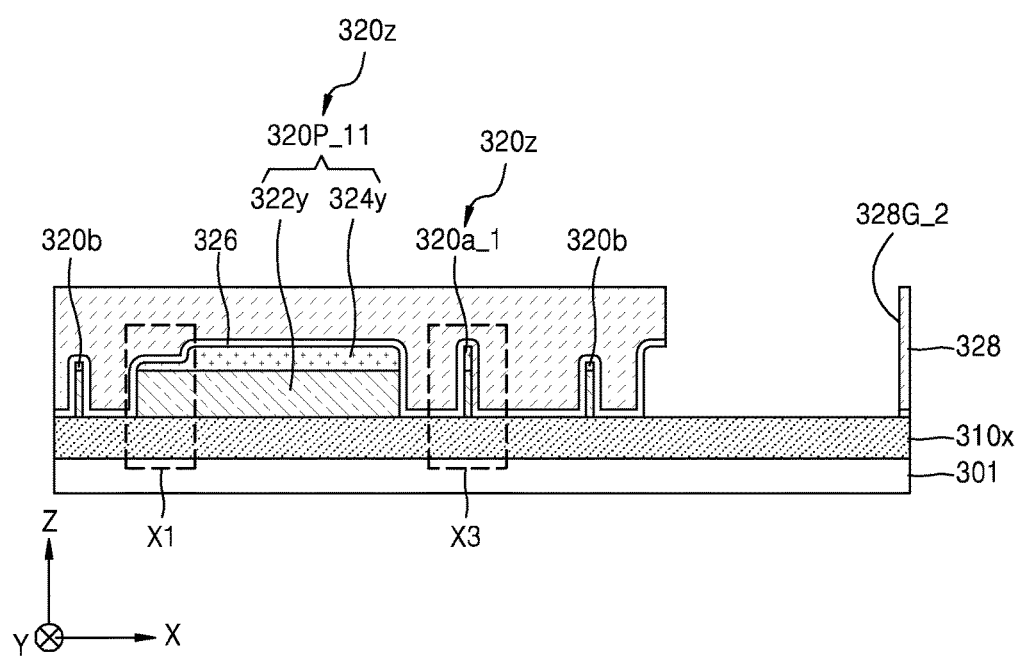

Referring to FIGS. 12A and 12B, a trim process is performed by using the second photoresist pattern 328 as an etch mask.

In detail, first, the lower spacer layer 326x located in the openings 328G_1 and 328G_2 is etched to form the lower spacer layer 326.

The etching of the lower spacer layer 326x may be performed, for example, by using an etch gas for silicon oxide. In some example embodiments, the etching process of the lower spacer layer 326x may be, for example, an anisotropic etching process.

In some example embodiments, during the etching of the lower spacer layer 326x, the lower sacrificial pattern structure 320y (refer to FIGS. 11A and 11B) located in the openings 328G_1 and 328G_2 may be partially or completely etched.

Then, the lower sacrificial pattern structure 320y in an area exposed through the openings 328G_1 and 328G_2 is removed. The removing of the lower sacrificial pattern structure 320y may be performed by an anisotropic etching process, an isotropic etching process, or an ashing or strip process.

When the removing of the lower sacrificial pattern structure 320y in the area exposed through the openings 328G_1 and 328G_2 is performed by using an isotropic etching process, the lower sacrificial pattern structure 320y in an area which is not exposed through the openings 328G_1 and 328G_2 but is adjacent to the openings 328G_1 and 328G_2 may also be partially removed. Accordingly, the lower pad portions 320P_1 and 320P_2 (refer to FIG. 11A) are separated as lower sacrificial pad portions 320P_11, 320P_12, 320P_21, and 320P_22, and the lower sacrificial line portion 320a (refer to FIG. 11A) is separated as lower sacrificial line portions 320a_1 and 320a_2.

In some example embodiments, the removing of the lower sacrificial pattern structure 320y may be performed in an in-situ method with the etching of the lower spacer layer 326x.

Figure 13A:
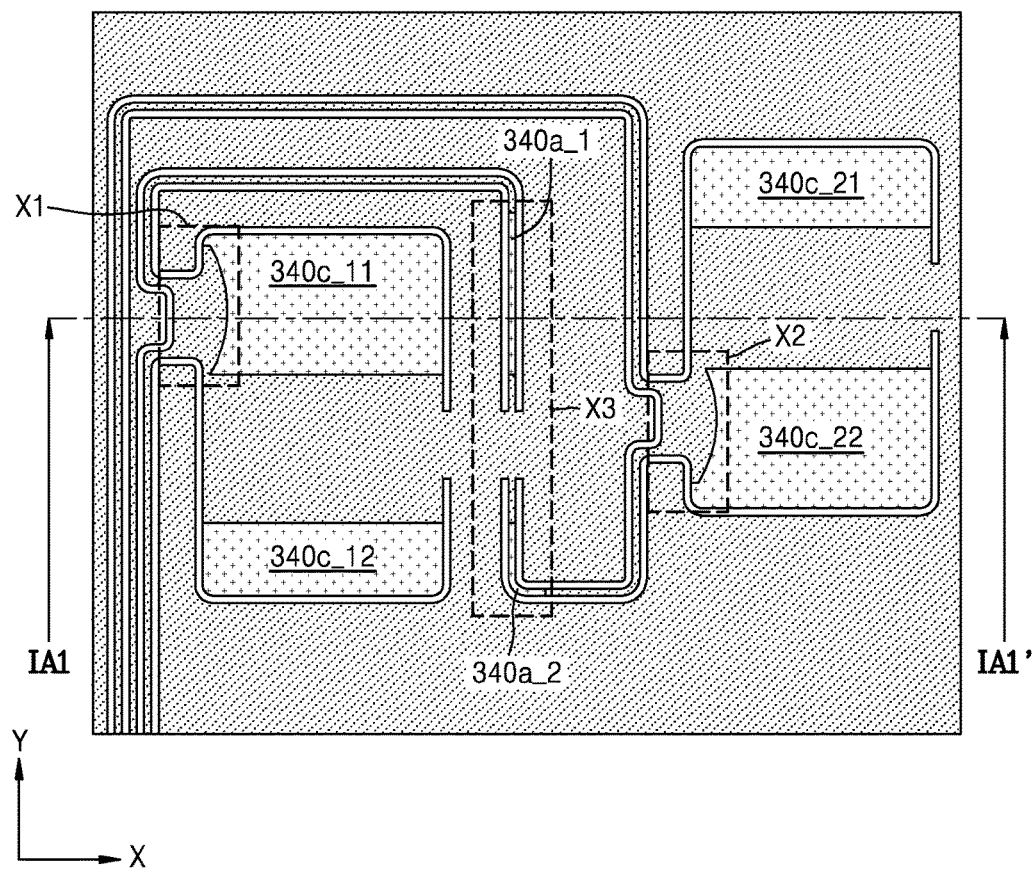
Figure 13B:
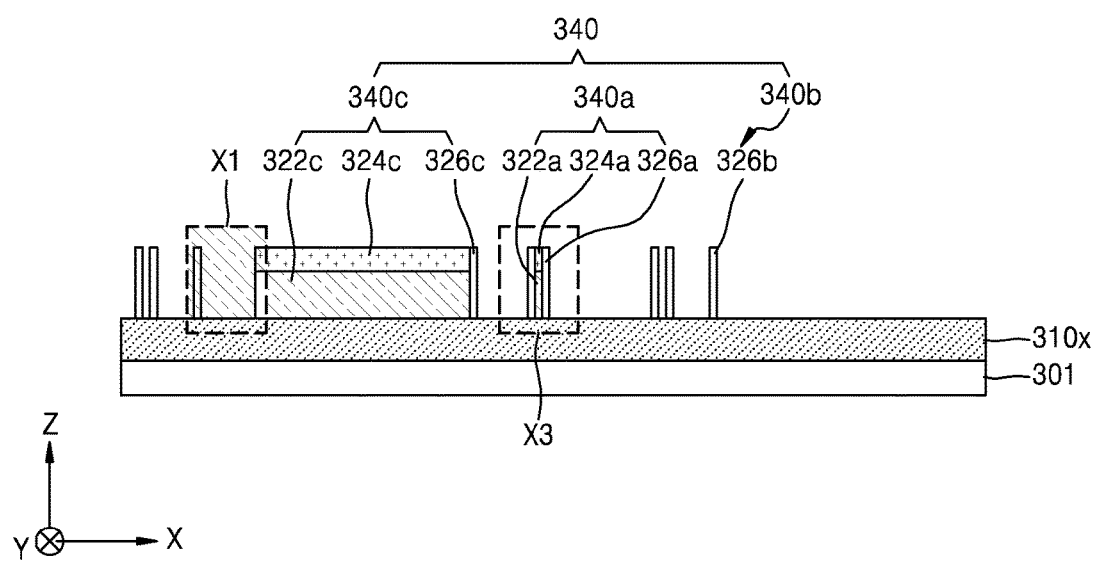

Referring to FIGS. 13A and 13B, after the second photoresist pattern 328 is removed, the lower spacer layer 326 and a lower sacrificial pattern structure 320z (refer to FIG. 12B) are etched to form a lower mask pattern 340.

To describe a method of forming the lower mask pattern 340 in detail, first, the lower spacer layer 326 is etched to form a plurality of lower spacer layers 326a, 326b, and 326c. The etching of the lower spacer layer 326 may be performed, for example, by an anisotropic etching process.

After the lower spacer layers 326a, 326b, and 326c are formed, the lower sacrificial pattern structure 320z (refer to FIG. 12B) is etched to form the lower sacrificial pattern structure 340.

In detail, the lower sacrificial line portion 320b (refer to FIG. 12B) may be removed so that a line mask 340b at both side walls of the lower sacrificial line portion 320b are formed apart from each other. Also, the first and second lower material layer patterns 322y and 324y formed in the area X1 of the lower sacrificial pad portion 320P_11 may be removed to form pad masks 340c_11 and 340c_12 spaced apart from each other. Similarly, the first and second lower material layer patterns 322y and 324y formed in the area X2 of the lower sacrificial pad portion 320P_22 may be removed to form pad masks 340c_21 and 340c_22 spaced apart from each other.

As described with reference to FIGS. 9A and 9B, the thickness of the second lower material layer pattern 324y formed into the lower sacrificial line portion 320b, in the area X1 of the lower sacrificial pad portion 320P_11, and in the area X2 of the lower sacrificial pad portion 320P_22 may be smaller than the thickness of the second lower material layer pattern 324y formed into the lower sacrificial line portions 320a_1 and 320a_2. Accordingly, the second lower material layer pattern 324y formed into the lower sacrificial line portion 320b, in the area X1 of the lower sacrificial pad portion 320P_11, and in the area X2 of the lower sacrificial pad portion 320P_22 may be removed in the above etching process, without an additional photo process. Also, the first lower material layer pattern 322y formed into the lower sacrificial line portion 320b, in the area X1 of lower sacrificial pad portion 320P_11, and in the area X2 of the lower sacrificial pad portion 320P_22 may be removed by using the remaining second lower material layer pattern 324y as an etch mask.

Through the above-described process, the lower mask pattern 340, including a bridge mask 340a formed of a lower spacer 326a, a remaining first lower material layer pattern 322a, and a remaining second lower material layer pattern 324a, the line mask 340b formed of a lower spacer 326b, and a pad mask 340c formed of a lower spacer 326c, a remaining first lower material layer pattern 322c, and a remaining second lower material layer pattern 324c, is completely formed.

By the processes described with reference to FIGS. 4A through 13B, the bridge mask 340a having a greater width than a width of the line mask 340b along the first direction (the X axis direction) may be formed without including an additional photo process in the processes described with reference to FIGS. 13A and 13B. Accordingly, since a complex photo process is not performed, process expenses may be reduced, and also, since the etching processes may be performed in an in-situ method, a process time may be reduced. In addition, misalignment, which may occur due to the additional photo process, may be limited (or, alternatively, prevented).

Referring to FIGS. 14A and 14B, a desired pattern structure 310 is formed by etching the etching object layer 310x by using the lower mask pattern 340 as an etch mask.

The pattern structure 310 includes a bridge pattern 310a, a line pattern 310b, and a contact pad 310c. The bridge pattern 310a, the line pattern 310b, and the contact pad 310c are as those described in detail earlier with reference to FIG. 3, and thus, they will not be described again.

Figure 15A:
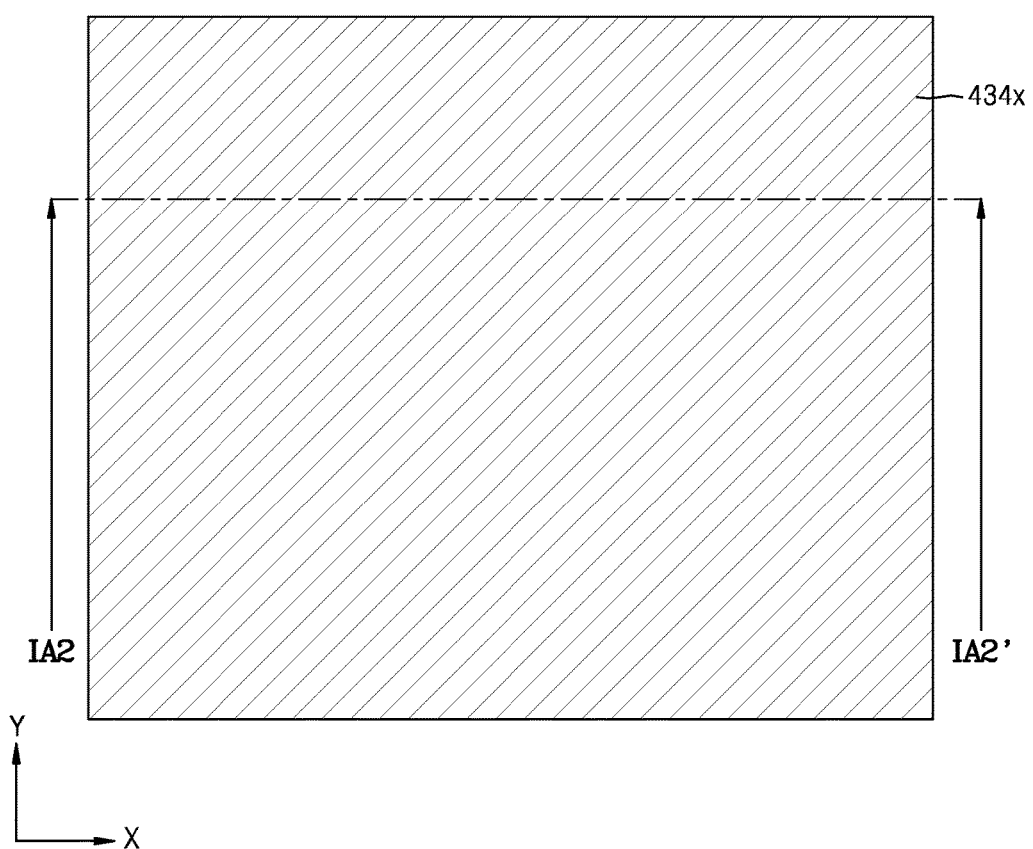

FIGS. 15A though 24B are cross-sectional views and plan views for describing an order of processes of a method of fabricating a flash memory device, according to another example embodiment. FIGS. As (FIG. 15A, FIG. 16A, FIG. 17A, FIG. 18A, FIG. 19A, FIG. 20A, FIG. 21A, FIG. 22A, FIG. 23A, FIG. 24A) are plan views corresponding to area A of FIG. 3. FIGS. Bs (FIG. 15B, FIG. 16B, FIG. 17B, FIG. 18B, FIG. 19B, FIG. 20B, FIG. 21B, FIG. 22B, FIG. 23B, FIG. 24B) are cross-sectional views taken along lines IA2-IA2' of FIGS. As.

In FIGS. 15A through 24B, like reference numerals denote like elements in FIGS. 1 through 14B. Here, for brevity of explanation, their descriptions will be omitted.

Figure 15B:
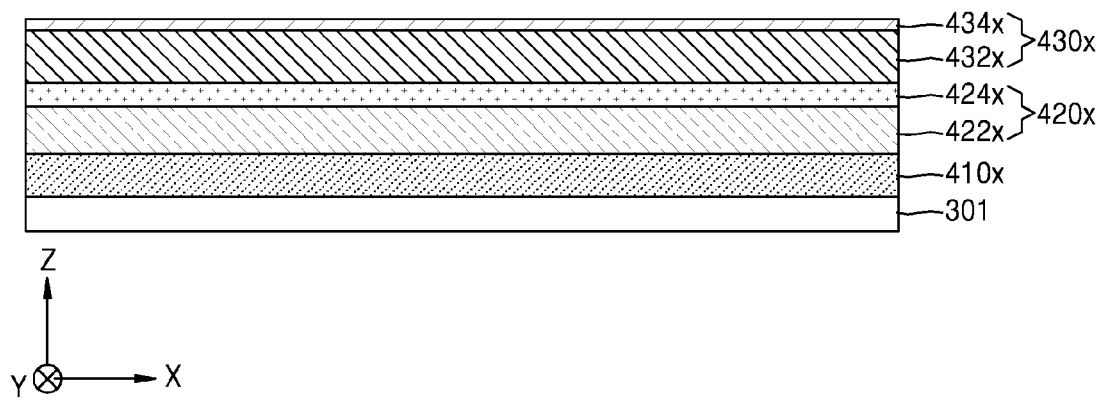

Referring to FIGS. 15A and 15B, an etching object layer 410x, a lower sacrificial layer 420x, and an upper sacrificial layer 430x are sequentially formed on the substrate 301.

The etching object layer 410x, the lower sacrificial layer 420x, and the upper sacrificial layer 430x may be formed of the same material and in the same method as the etching object layer 310x, the lower sacrificial layer 320x, and the upper sacrificial layer 330x, respectively, which are described with reference to FIGS. 4A and 4B.

The lower sacrificial layer 420x may be a stack of a first lower material layer 422x and a second lower material layer 424x, similarly as the lower sacrificial layer 320x, and the upper sacrificial layer 430x may be a stack of a first upper material layer 432x and a second upper material layer 434x, similarly as the upper sacrificial layer 330x.

Figure 16A:
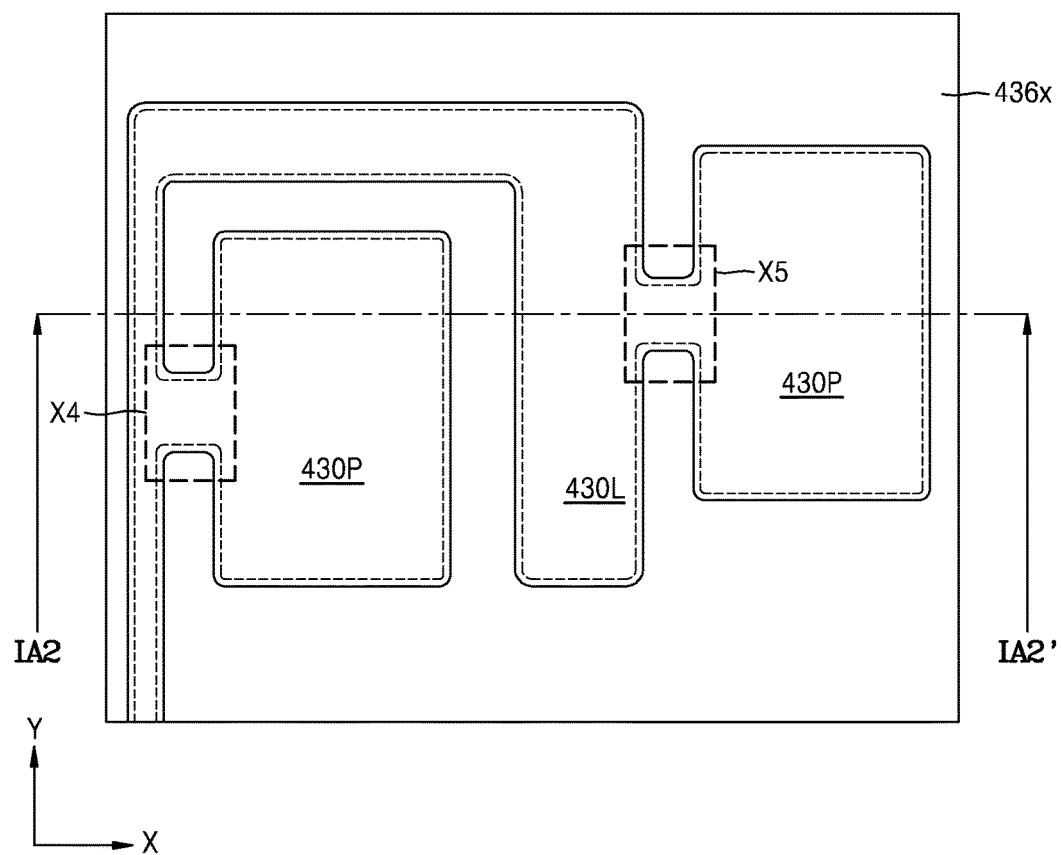
Figure 16B:
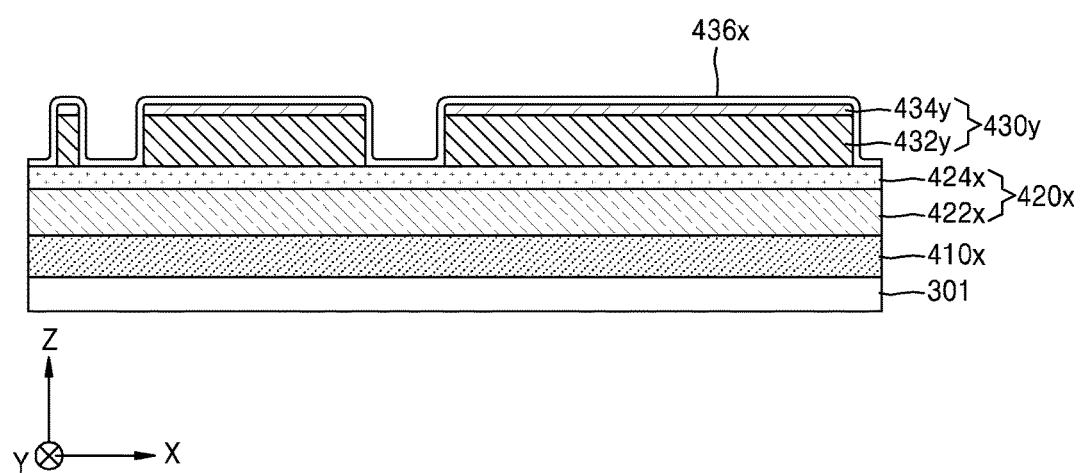

Referring to FIGS. 16A and 16B, the upper sacrificial layer 430x is patterned by a photolithography process to form an upper sacrificial pattern structure 430y. An upper spacer layer 436x is formed on the upper sacrificial pattern structure 430y.

The forming of the upper sacrificial pattern structure 430y and the upper spacer layer 436x may be performed similarly as the forming of the upper sacrificial pattern structure 330y and the upper spacer layer 336x described with reference to FIGS. 5A through 6B. There is only a difference in areas X4 and X5 in which an upper sacrificial pad portion 430P and an upper sacrificial line portion 430L contact each other.

Figure 17A:
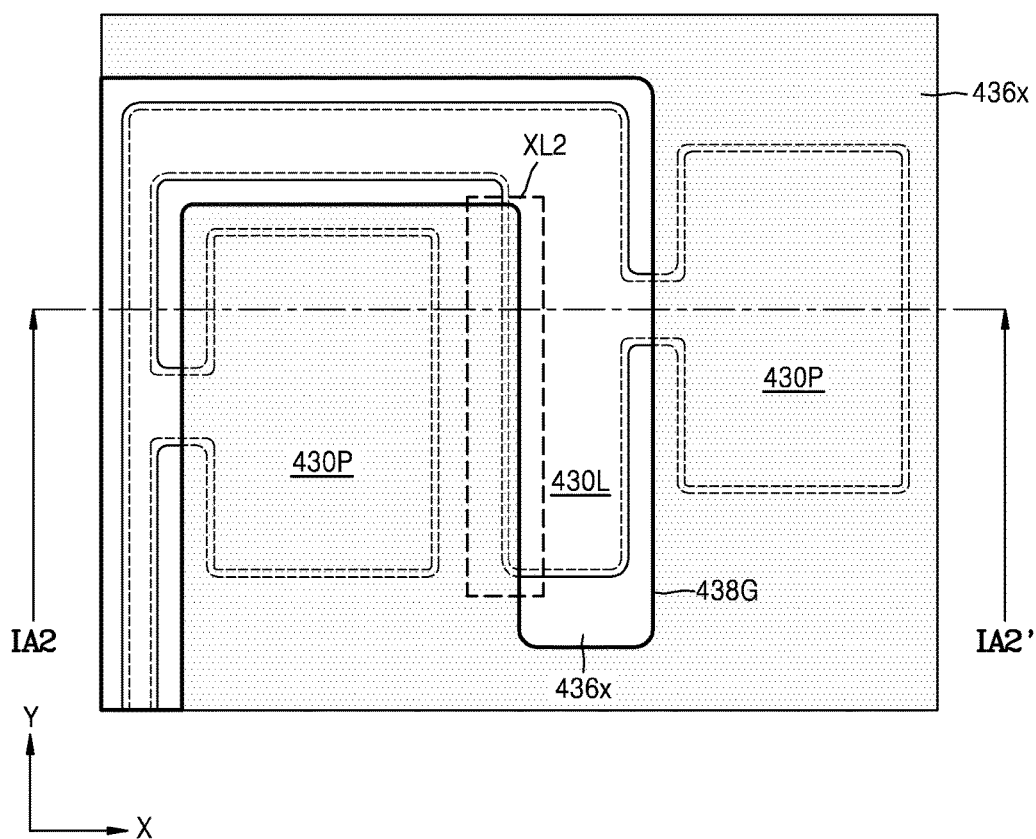
Figure 17B:
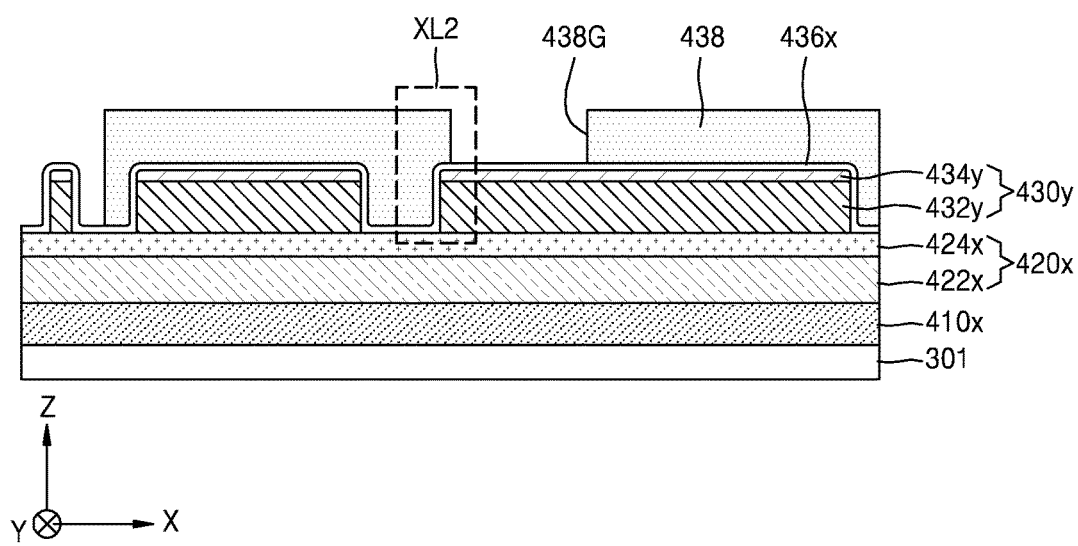

Referring to FIGS. 17A and 17B, the upper spacer layer 436x is coated with a photoresist layer (not shown) and a photo process is performed, in order to form a first photoresist pattern 438.

The first photoresist pattern 438 includes an opening 438G exposing at least a portion of the upper spacer layer 436x.

Figure 24A:
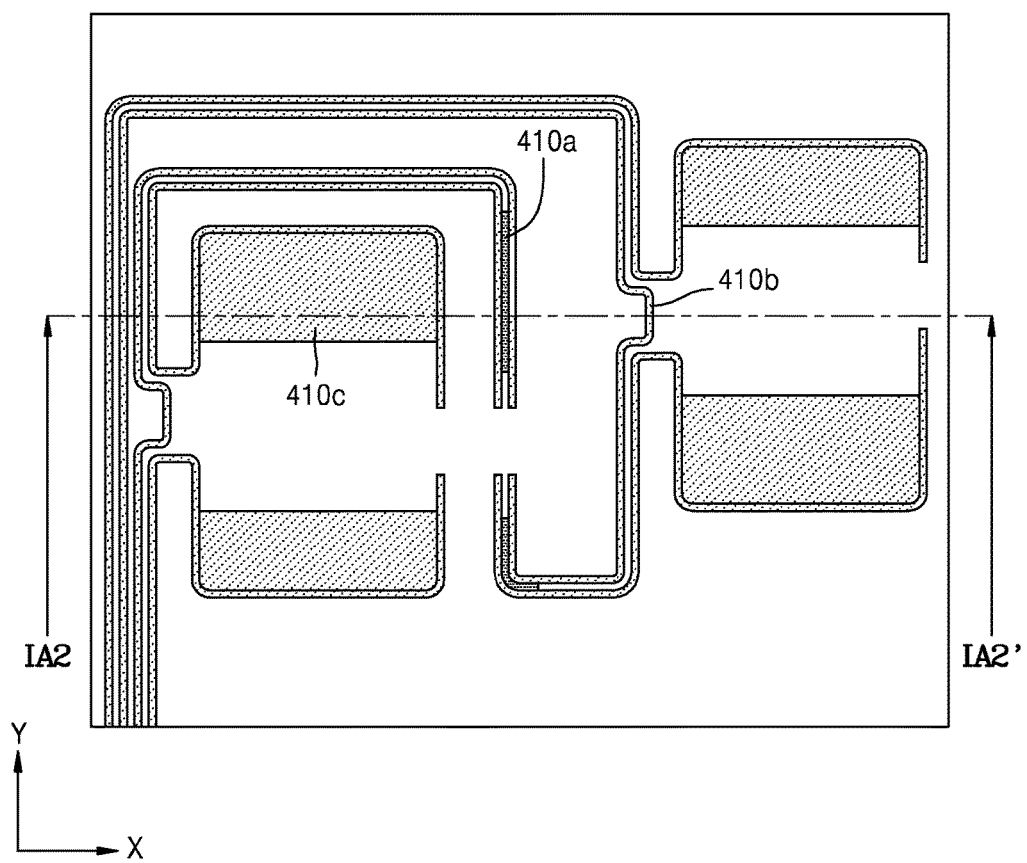
Figure 24B:
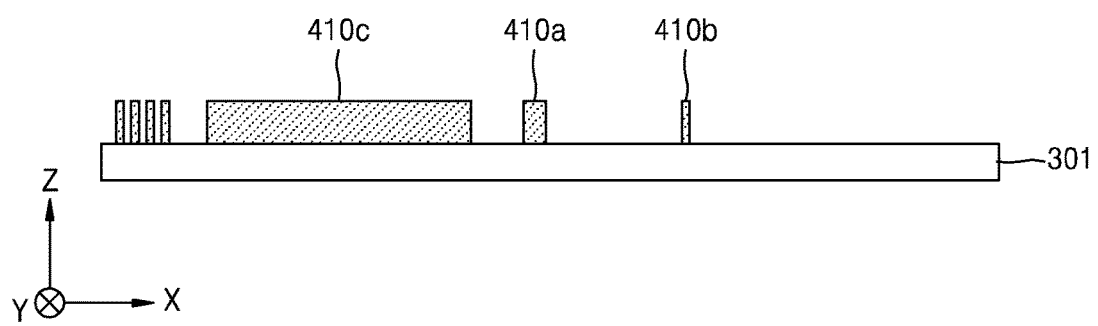

The opening 438G of the first photoresist pattern 438 may be formed such that the opening 438G exposes the upper spacer layer 436x in an area in which the upper sacrificial line portion 430L is located and does not expose the upper spacer layer 436x in at least an area XL2 of the upper sacrificial line portion 430L. Bridge patterns 410a, which will be described later with reference to FIGS. 24A and 24B, are formed in the area XL2 of the upper sacrificial line portion 430L.

Figure 18A:
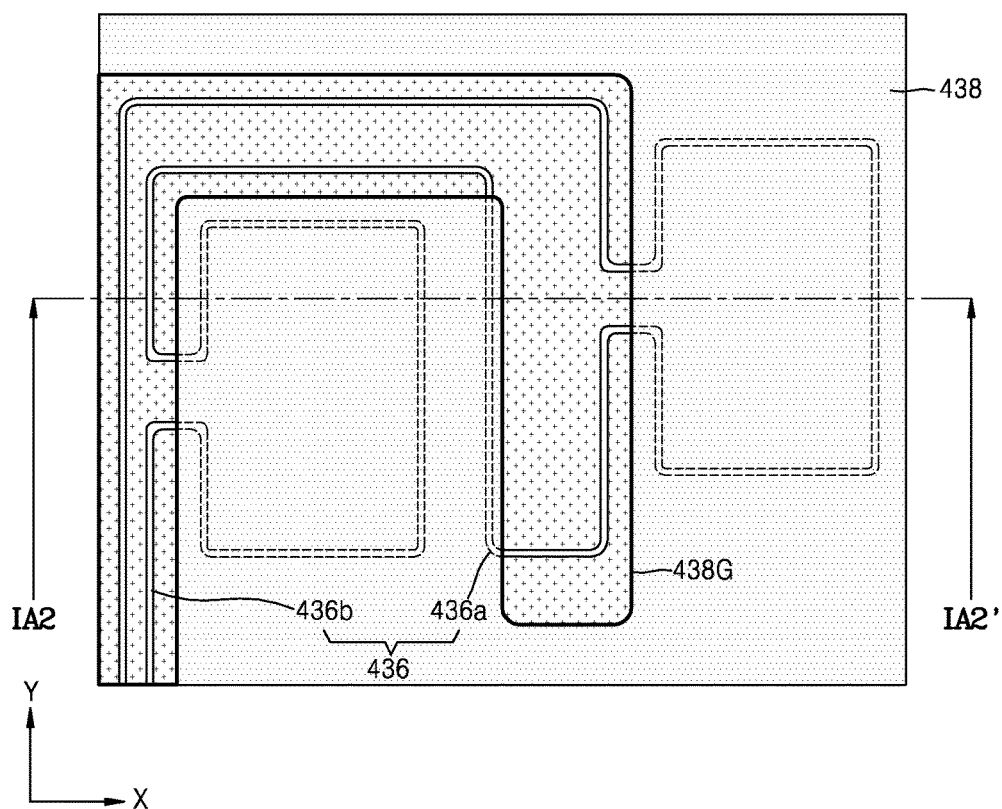
Figure 18B:
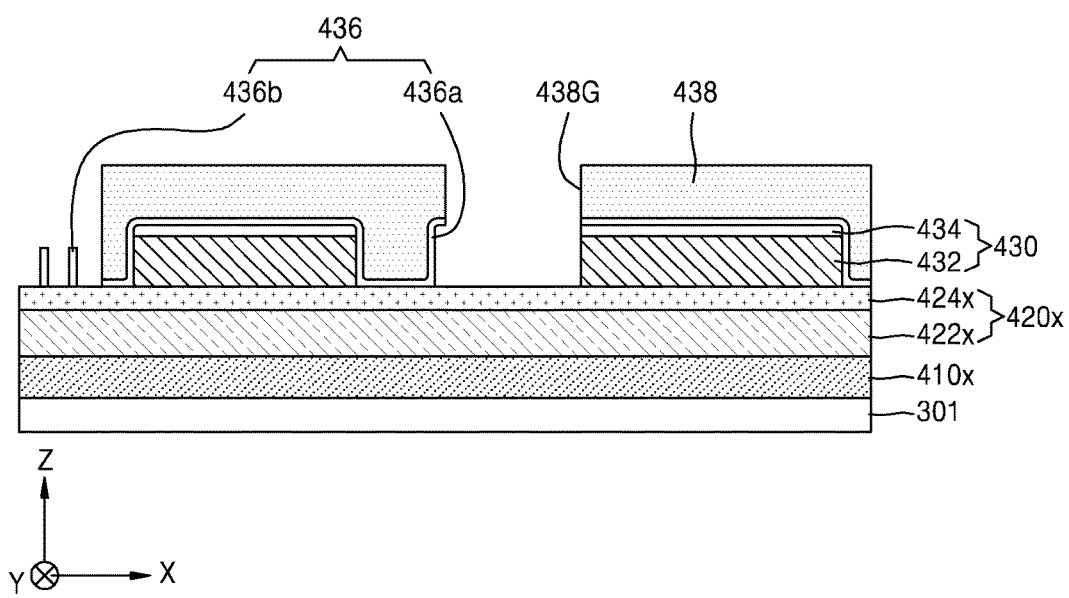

Referring to FIGS. 18A and 18B, an upper spacer layer 436 is formed by etching the upper spacer layer 436x located in the opening 438G by using the first photoresist pattern 438 as an etch mask. An upper sacrificial pattern structure 430 is formed by etching the upper sacrificial pattern structure 430y in an area exposed through the opening 438G.

The remaining upper spacer layer 436 after the etching of the upper spacer layer 436x includes upper spacers 436a and 436b.

The etching of the upper spacer layer 436x and the etching of the upper sacrificial pattern structure 430y may be performed by a similar method of etching the upper spacer layer 336x and the etching of the upper sacrificial pattern structure 330y, respectively, described with reference to FIGS. 8A and 8B.

However, the etching of the upper sacrificial pattern structure 430y according to the present example embodiment is performed by an anisotropic etching process. Accordingly, the groove H formed at the lower side wall portion of the opening 338G adjacent to the upper sacrificial pad portion 330P, described with reference to FIGS. 8A and 8B, is not formed in the present example embodiment.

Figure 19A:
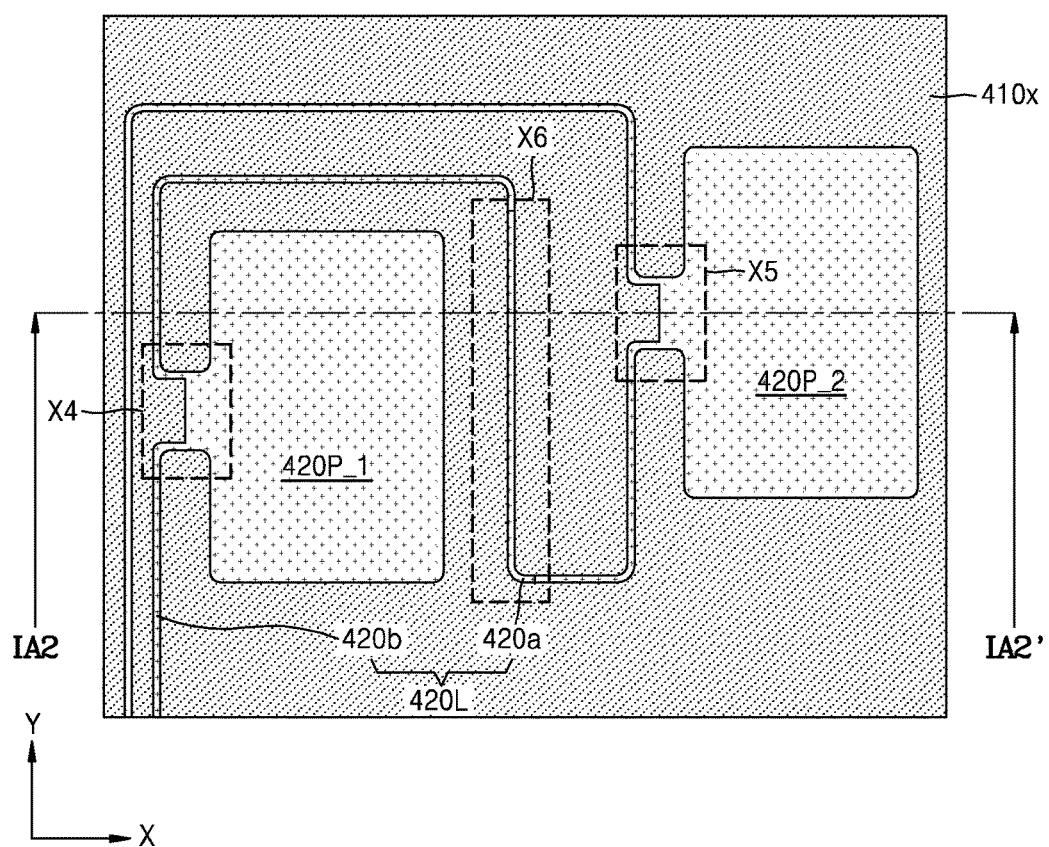
Figure 19B:
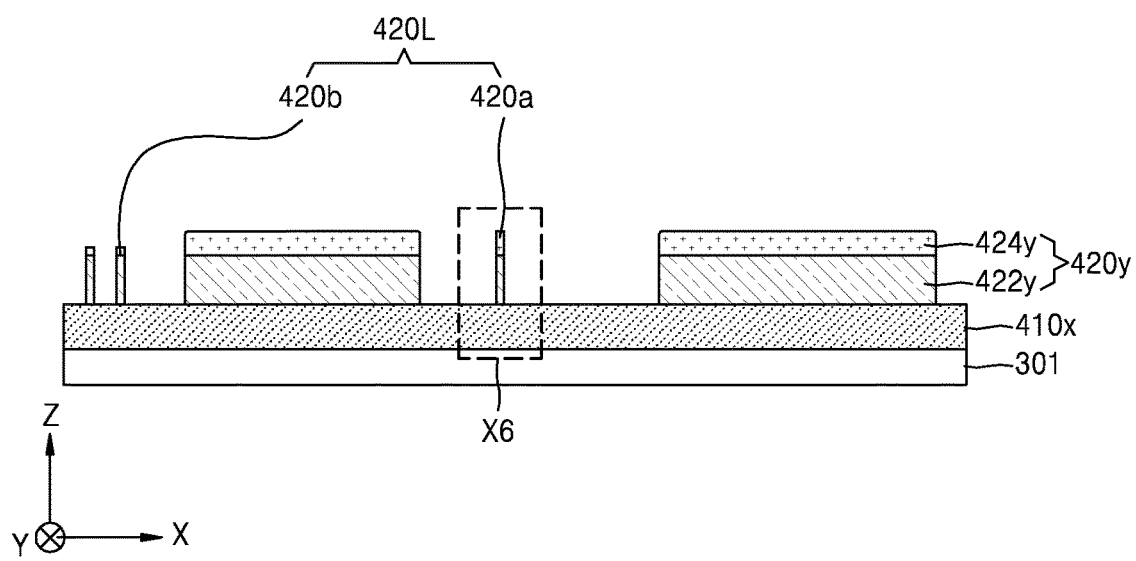

Referring to FIGS. 19A and 19B, after the first photoresist pattern 438 is removed, the upper sacrificial pattern structure 430 and the upper spacers 436a and 436b are used as etch masks to etch the lower sacrificial layer 420x, in order to form a lower sacrificial structure 420y.

The lower sacrificial pattern structure 420y may include lower sacrificial pad portions 420P_1 and 420P_2 and a lower sacrificial line portion 420L. Each of the lower sacrificial pad portions 420P_1 and 420P_2 and the lower sacrificial line portion 420L may be a stack of a first lower material layer pattern 422y and a second lower material layer pattern 424y that are sequentially formed.

An upper surface of the lower sacrificial line portion 420L may have a step portion. For example, the upper surface of a lower sacrificial line portion 420a in an area X6 may be higher than the upper surface of a lower sacrificial line portion 420b in other areas than the area X6.

In some example embodiments, the lower sacrificial line portion 420b may be formed only of the first lower material layer pattern 422y. For example, the second lower material layer pattern 424y as the lower sacrificial line portion 420b may be completely etched in the process of forming the lower sacrificial structure 420y.

Unlike the lower sacrificial pad portion 320P described with reference to FIGS. 9A and 9B, upper surfaces of the lower sacrificial pad portions 420P_1 and 420P_2 do not have step portions.

This is because the upper sacrificial pattern structure 430 serving as an etch mask does not have a structure having the groove H of the upper sacrificial pattern structure 330 described with reference to FIGS. 8A and 8B.

Figure 20A:
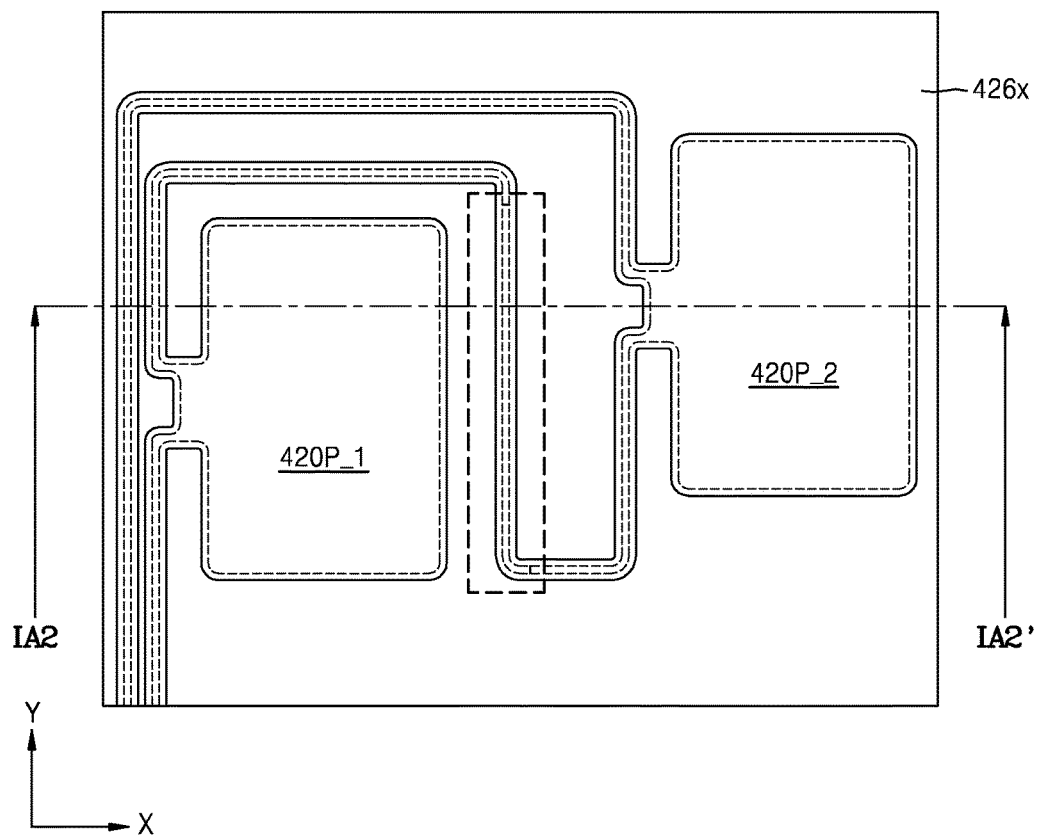
Figure 20B:
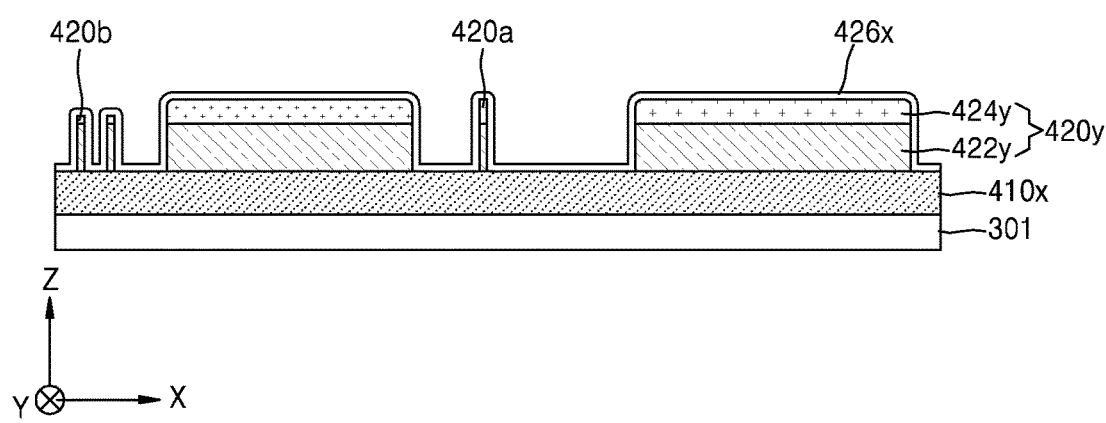

Referring to FIGS. 20A and 20B, a lower spacer layer 426x is formed and covers side walls and an upper surface of the lower sacrificial pattern structure 420y on the etching object layer 410x. The lower spacer layer 426x may be formed of the same material and in the same method as the lower spacer layer 326x described with reference to FIGS. 10A and 10B.

Figure 21A:
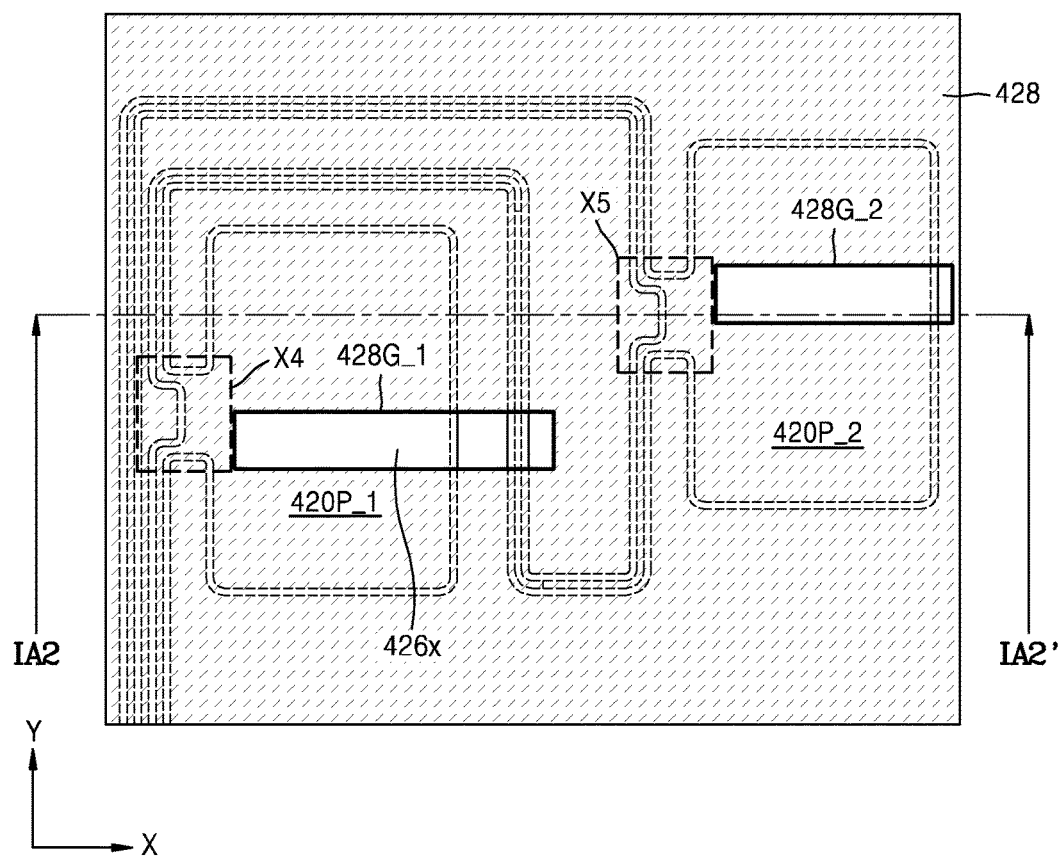
Figure 21B:
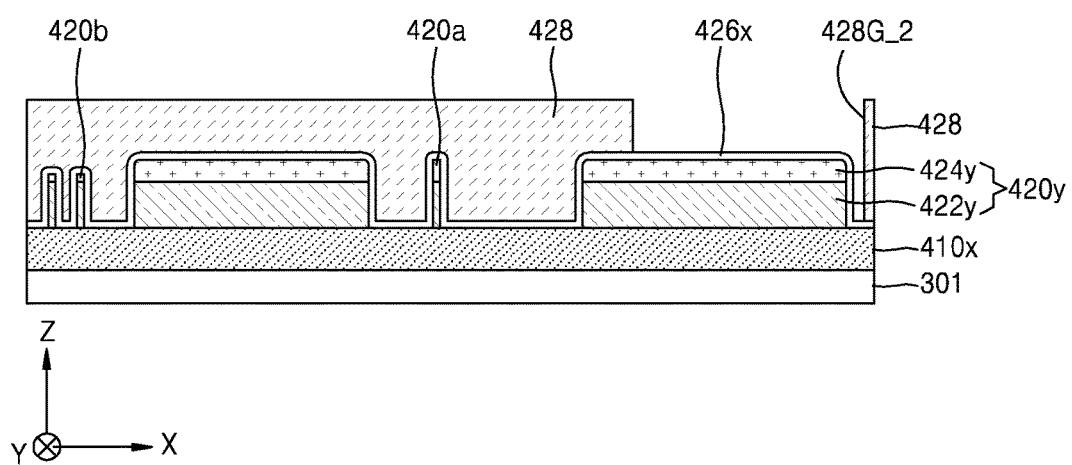

Referring to FIGS. 21A and 21B, a second photoresist pattern 428 is formed by coating the lower spacer layer 426x with a photoresist layer (not shown) and then performing a photo process. The second photoresist pattern 428 includes openings 428G_1 and 428G_2 exposing at least a portion of the lower spacer layer 426x.

Figure 22A:
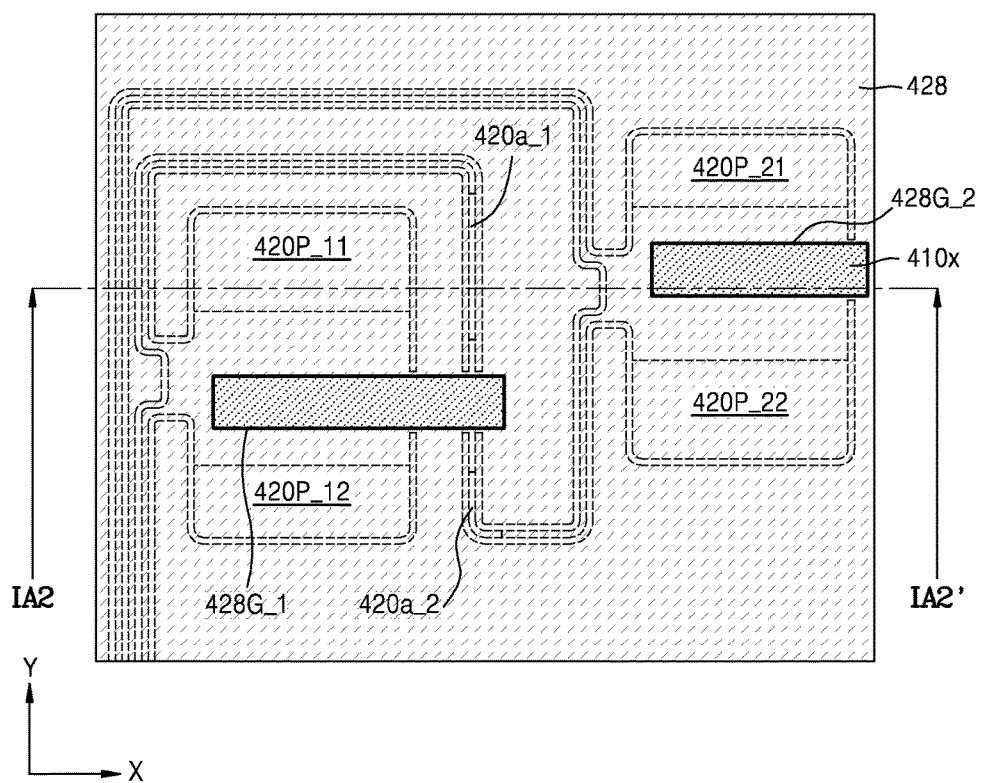

In the trim process (refer to FIGS. 22A and 22B), which is the sequential process, the openings 428G_1 and 428G_2 may be located in the same line as the area X4 in which the lower sacrificial pad portion 420P_1 contacts the lower sacrificial line portion 420b and the area X5 in which the lower sacrificial pad portion 420P_2 contacts the lower sacrificial line portion 420b, respectively, along the first direction (the X axis direction), in order to separate the lower sacrificial pad portions 420P_1 and 420P_2 as lower sacrificial pad portions 420P_11, 420P_12, 420P_21, and 420P_22 (refer to FIG. 22A).

The opening 428G_1 of the second photoresist pattern 428 may be formed such that the opening 428G_1 exposes the lower spacer layer 426x in a portion of the lower sacrificial pad portion 420P_1 and a portion of the lower sacrificial line portion 420a. The opening 428G_2 may be formed such that the opening 428G_2 exposes the lower spacer layer 426x in a portion of the lower sacrificial pad portion 420P_2.

Figure 22B:
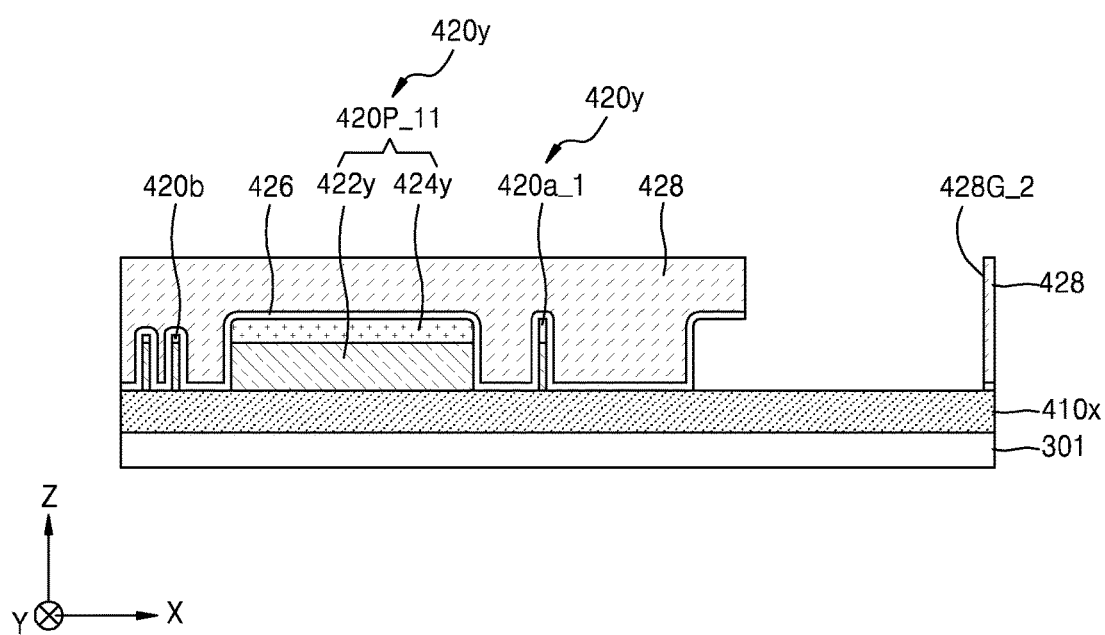

Referring to FIGS. 22A and 22B, a trim process is performed by using the second photoresist pattern 428 as an etch mask to form a lower spacer layer 426, the lower sacrificial pad portions 420P_11, 420P_12, 420P_21, and 420P_22, and lower sacrificial line portions 420a_1 and 420a_2.

The trim process may be performed similarly as the trim process described with reference to FIGS. 12A and 12B. By the trim process, the lower sacrificial pad portions 420P_1 and 420P_2 are separated as the lower sacrificial pad portions 420P_11, 420P_12, 420P_21, and 420P_22.

Figure 23A:
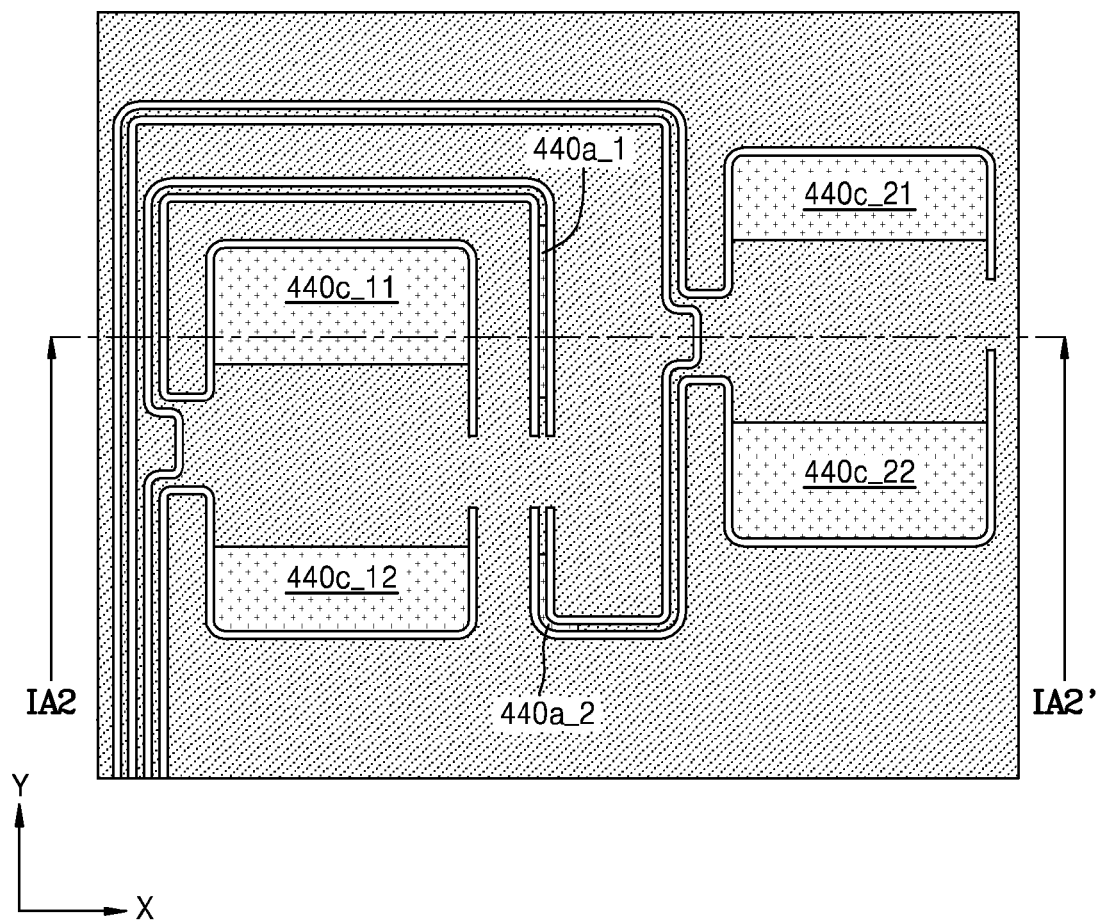
Figure 23B:
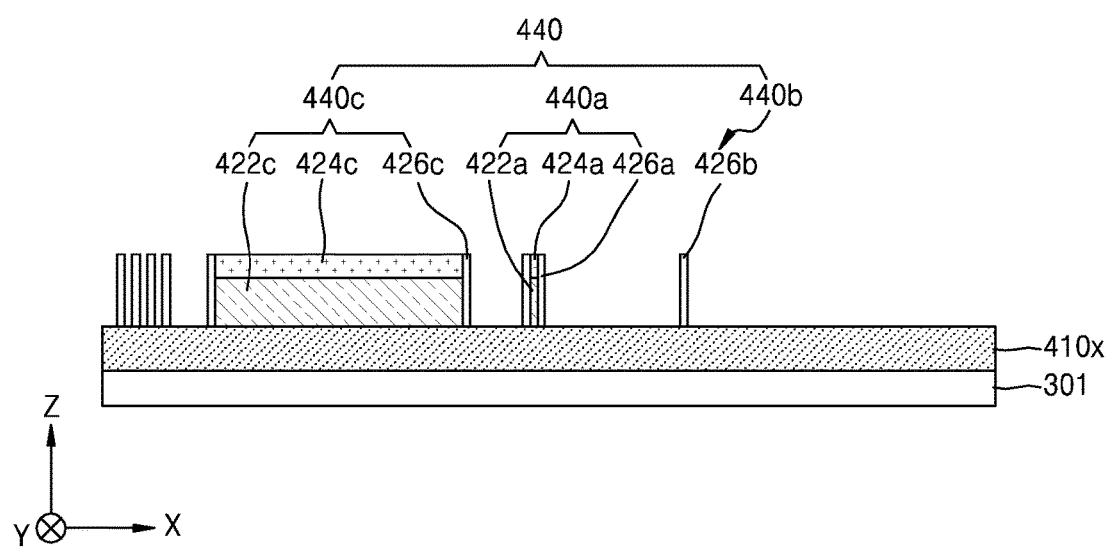

Referring to FIGS. 23A and 23B, after the second photoresist pattern 428 is removed, the lower spacer layer 426 and the lower sacrificial pattern structure 420y (refer to FIG. 22b) are etched to form a lower mask pattern 440.

The lower mask pattern 440 may be formed by etching the lower sacrificial pattern structure 420y after forming a plurality of lower spacer layers 426a, 426b, and 426c by etching the lower spacer layer 426, similarly as the lower mask pattern 340 described with reference to FIGS. 13A and 13B.

Through the process described above, the lower mask pattern 440, including a bridge mask 440a formed of a lower spacer 426a and a remaining first lower material layer pattern 422a, and a remaining second lower material layer pattern 424a, a line mask 440b formed of the lower spacer 426b, and a pad mask 440c formed of a lower spacer 426c, a remaining first lower material layer pattern 422c, and a remaining second lower material layer pattern 424c, is completely formed.

Referring to FIGS. 24A and 24B, a pattern structure, including bridge patterns 410a, a line pattern 410b, and a contact pad 410c, is formed by etching the etching object layer 410x by using the lower mask pattern 440 as an etch mask.

FIGS. 25A through 32B are cross-sectional views and plan views for describing an order of processes of a method of fabricating a flash memory device, according to another example embodiment. FIGS. As (FIG. 25A, FIG. 26A, FIG. 27A, FIG. 28A, FIG. 29A, FIG. 30A, FIG. 31A, FIG. 32A) are plan views corresponding to area B of FIG. 3. FIGS. Bs (FIG. 25B, FIG. 26B, FIG. 27B, FIG. 28B, FIG. 29B, FIG. 30B, FIG. 31B, FIG. 32B) are cross-sectional views taken along lines IB-IB' of FIGS. As.

In FIGS. 25A through 32B, like reference numerals denote like elements in FIGS. 1 through 24B. For brevity of explanation, they will not be described again.

Figure 25A:
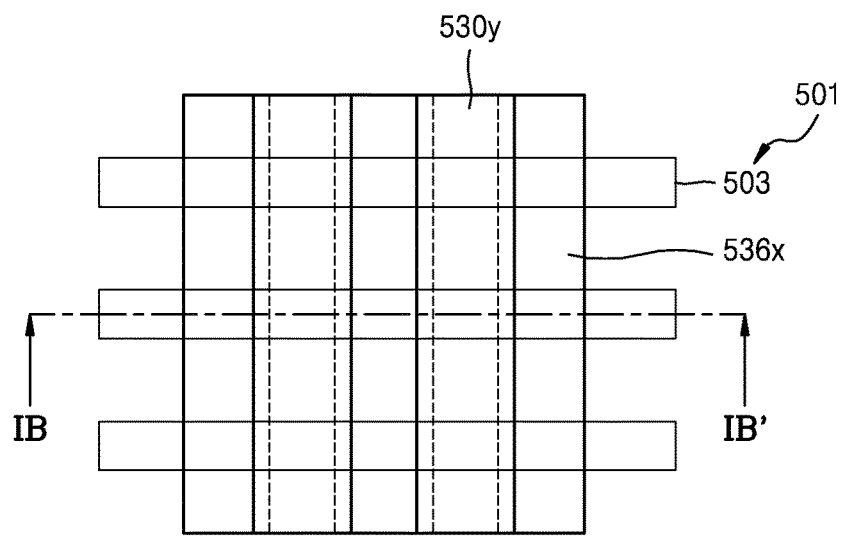
Figure 25B:
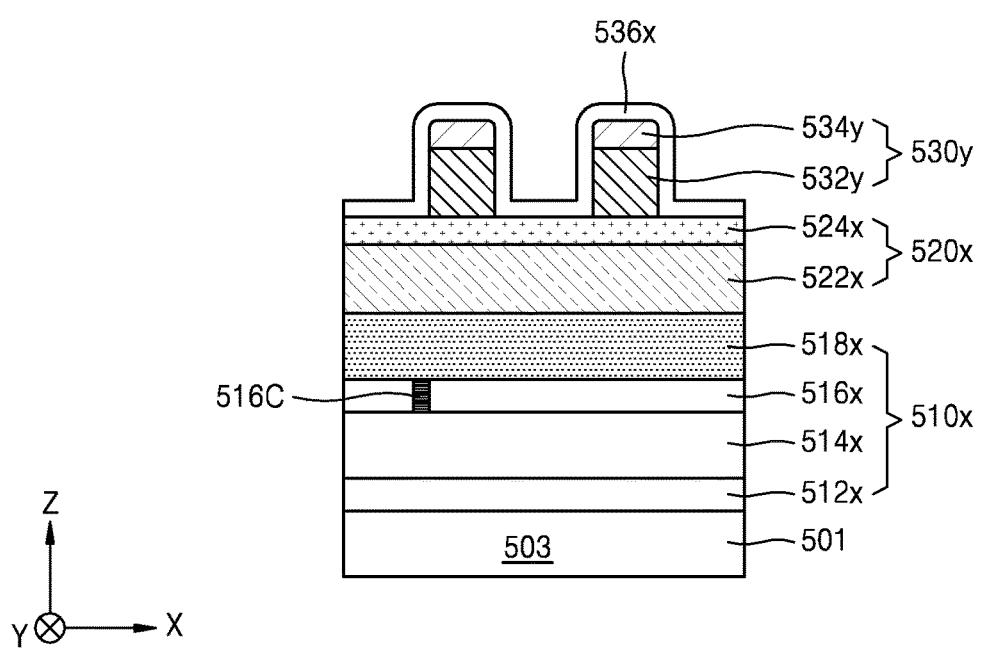

Referring to FIGS. 25A and 25B, an etching object layer 510x is formed on a substrate 501.

The substrate 501 may include, for example, any of silicon-on-insulator, silicon-on-sapphire, germanium, silicon-germanium, and gallium-arsenide.

A plurality of active areas 503 extending along the first direction (the X axis direction) and arranged in parallel with one another along the second direction (the Y axis direction) are defined in the substrate 501. Trenches (not shown) are included between each pair of the plurality of active areas 503, and a device separating layer (not shown) is formed by filling the trenches with an insulating material.

The etching object layer 510x formed on the substrate 501 may be a stack of a tunneling insulating layer 512x, a charge storage layer 514x, a blocking insulating layer 516x, and a gate conductive layer 518x, which are sequentially formed.

The tunneling insulating layer 512x may be formed of any one selected from silicon oxide, silicon nitride, silicon oxynitride, hafnium oxide, hafnium silicon oxide, aluminium oxide, and zirconium oxide, or may be a stack of a plurality of layers formed of a combination thereof.

The charge storage layer 514x on the tunneling insulating layer 512x serves to store data of a nonvolatile memory device. The charge storage layer 514x may be formed as a silicon nitride layer or a high-k film having a higher dielectric constant than the silicon nitride layer. For example, the charge storage layer 514x may be formed as a silicon nitride layer, a metal oxide layer, a metal nitride layer, or a combination thereof. In a charge trap flash method, the charge storage layer 514x may include a silicon nitride layer. Also, in a floating gate method, the charge storage layer 514x may include polysilicon doped with impurities.

The blocking insulating layer 516x is formed on the charge storage layer 514x and functions to prevent charges stored in the charge storage layer 514x from leaking to the gate conductive layer 518x. The blocking insulating layer 516x may be formed of at least one selected from the group consisting of $Al_2O_3$, $SiO_2$, $HfO_2$, $ZrO_2$, LaO, LaAlO, LaHfO, and HfAlO. The blocking insulating layer 516x may be, for example, a stack of a lower dielectric layer, a high dielectric layer, and an upper dielectric layer that are sequentially formed.

The blocking insulating layer 516x in an area overlapping a first line pattern 510a, which is to be formed by a sequential process, may include a butting contact hole 516C.

The gate conductive layer 518x may be formed on the blocking insulating layer 516x. The gate conductive layer 518x may include polysilicon, metal, or metal silicide material doped with impurities or a combination thereof.

After the etching object layer 510x is formed, a lower sacrificial layer 520x, upper sacrificial pattern structures 530y, and an upper spacer layer 536x are sequentially formed on the etching object layer 510x.

The lower sacrificial layer 520x, the upper sacrificial pattern structures 530y, and the upper spacer layer 536x may be formed by a similar method as the lower sacrificial layer 320x, the upper sacrificial pattern structure 330y, and the upper spacer layer 336x, respectively, which are described with reference to FIGS. 4A through 6B.

The lower sacrificial layer 520x may be a stack of a first lower material layer 522x and a second lower material layer 524x, similarly as the lower sacrificial layer 320x (refer to FIG. 3B), and the upper sacrificial pattern structures 530y may be a stack of a first upper material layer pattern 532y and a second upper material layer pattern 534y, similarly as the upper sacrificial pattern structure 330y (refer to FIG. 5B).

The upper sacrificial pattern structures 530y are arranged in parallel with one another along the first direction (the X axis direction), and each of the upper sacrificial pattern structures 530y may have a linear shape by extending along the second direction (the Y axis direction) to cross the active areas 503.

The upper sacrificial pattern structures 530y in the present example embodiment are formed as two upper sacrificial pattern structures 530y_1 and 530y_2. However, the number of upper sacrificial pattern structures 530y is not limited thereto.

Figure 26A:
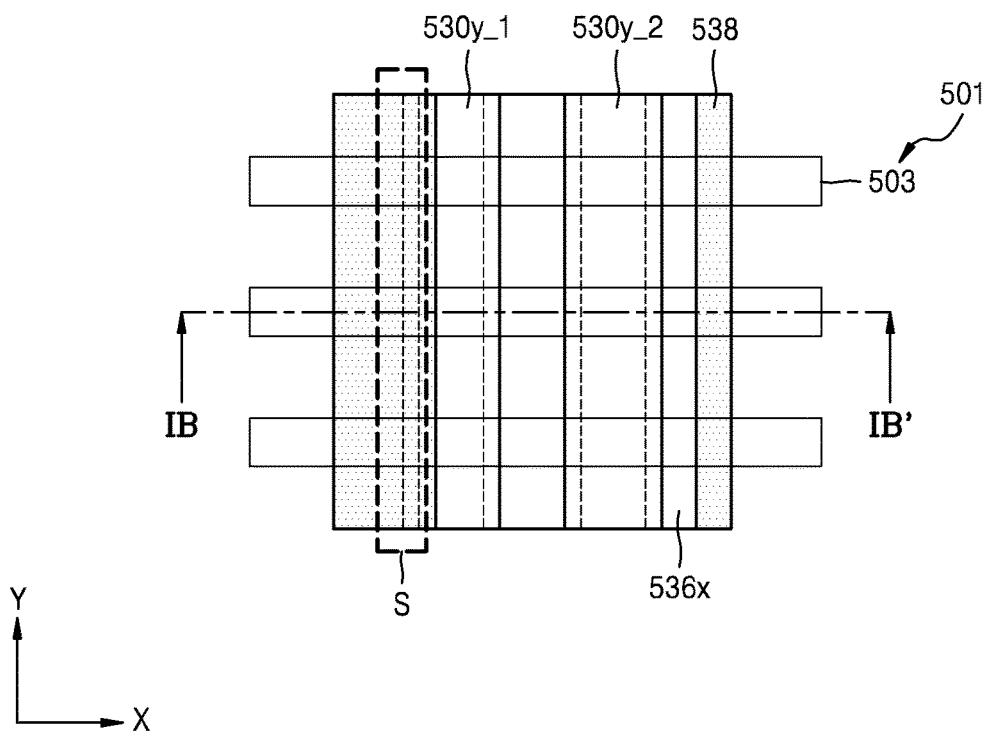
Figure 26B:
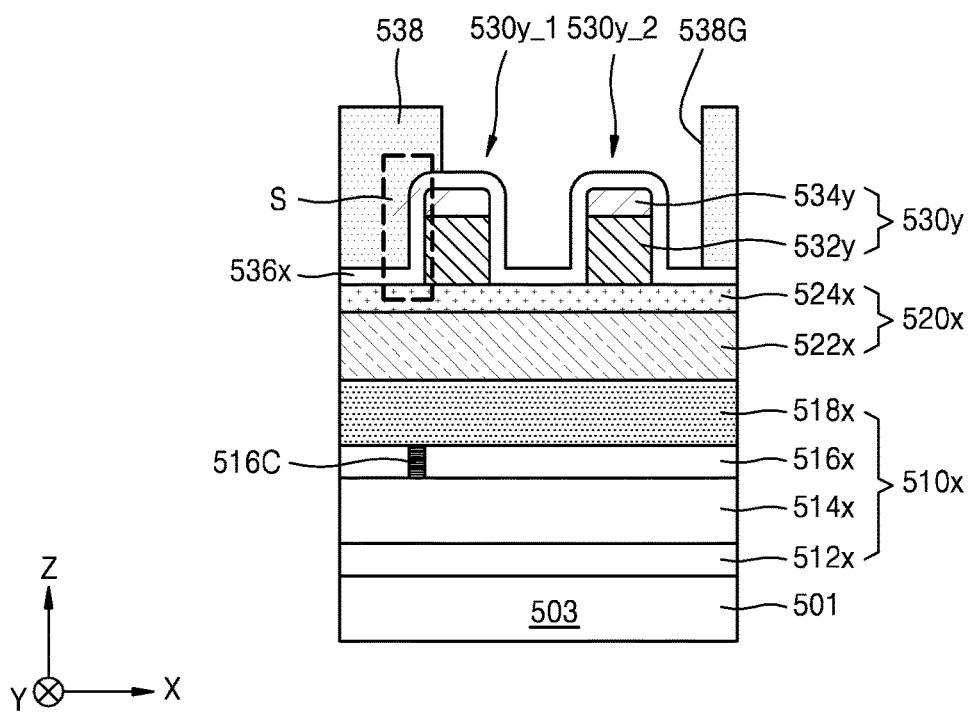

Referring to FIGS. 26A and 26B, a first photoresist pattern 538 is formed by coating the upper spacer layer 536x with a photoresist layer (not shown) and then performing a photo process.

The first photoresist pattern 538 includes an opening 538G exposing at least a portion of the upper spacer layer 536x.

The first photoresist pattern 538 may cover the upper spacer layer 536x at a side wall S of the upper sacrificial pattern structure 530y_1. The opening 538G of the first photoresist pattern 538 may expose the upper spacer layer 536x at the other side wall of the upper sacrificial pattern structure 530y_1, wherein the other side wall faces the side wall S, and the upper spacer layer 536x is on the upper sacrificial pattern structure 530y_2.

The side wall S of the upper sacrificial pattern structure 530y_1 may be located in an area perpendicularly overlapping a string selection line 510a, which will be described later with reference to FIGS. 32A and 32B. The butting contact hole 516C may be located such that the butting contact hole 516C perpendicularly overlaps the side wall S of the upper sacrificial pattern structure 530y_1.

Figure 27A:
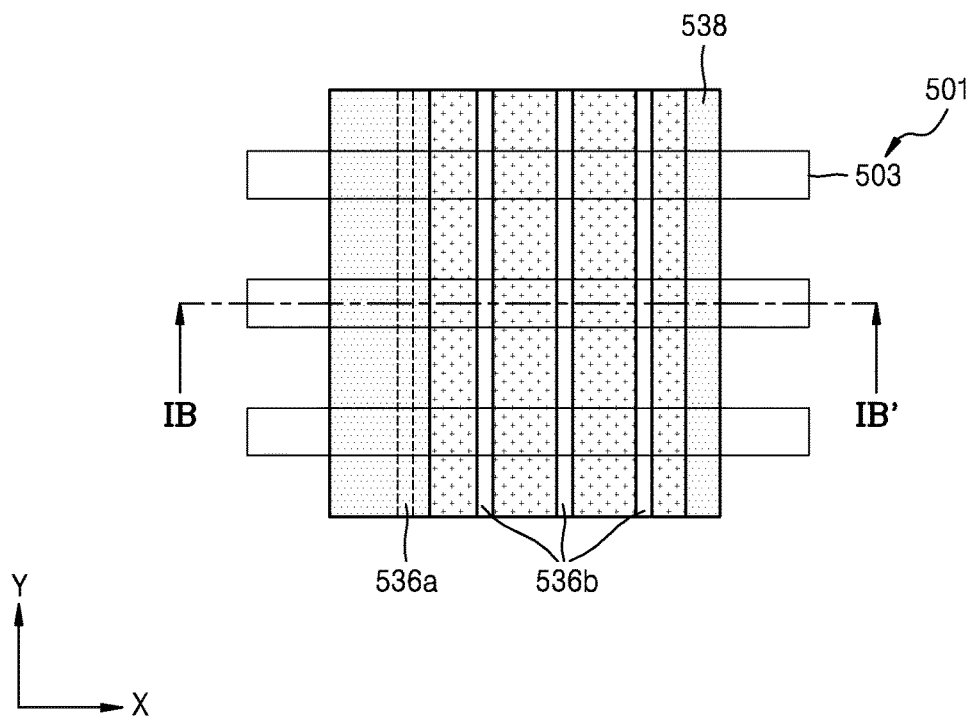
Figure 27B:
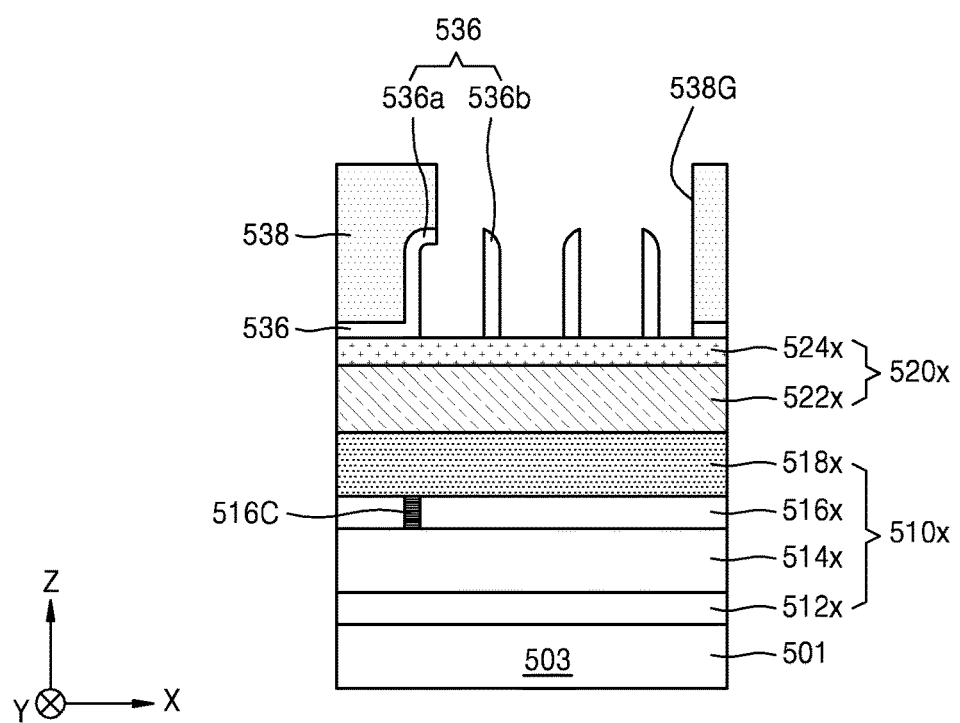

Referring to FIGS. 27A and 27B, the upper spacer layer 536x located in the opening 538G is etched by using the first photoresist pattern 538 as an etch mask to form an upper spacer layer 536, and the upper sacrificial pattern structures 530y in areas exposed through the opening 538G are removed.

The remaining upper spacer layer 536 after the etching of the upper spacer layer 536x may include a first upper spacer 536a and second upper spacers 536b.

In the etching process of the upper spacer layer 536x, the first upper spacer 536a is covered by the photoresist pattern 538 and the second upper spacers 536b are exposed through the opening 538G. Accordingly, a height of the first upper spacer 536a along the third direction (the Z axis direction) becomes greater than a height of each of the second upper spacers 536b along the third direction (the Z axis direction).

The etching of the upper spacer layer 536x and the removing of the upper sacrificial pattern structures 530y may be performed by a similar method of etching the upper spacer layer 336x and etching the upper sacrificial pattern structure 330y, respectively, described with reference to FIGS. 8A and 8B.

Figure 28A:
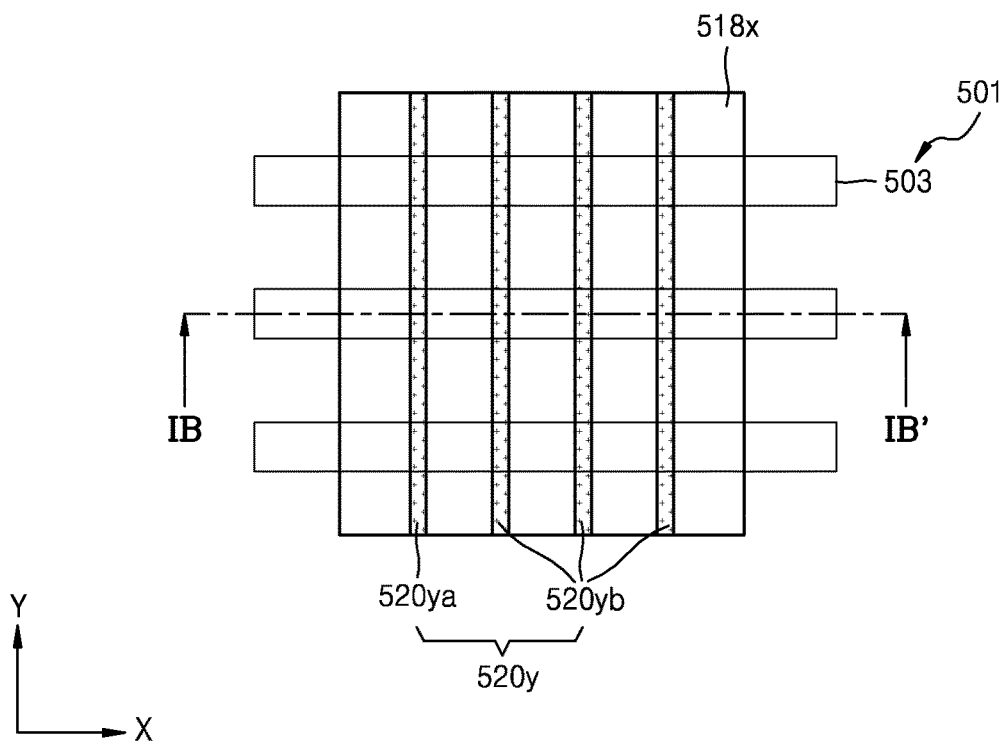
Figure 28B:
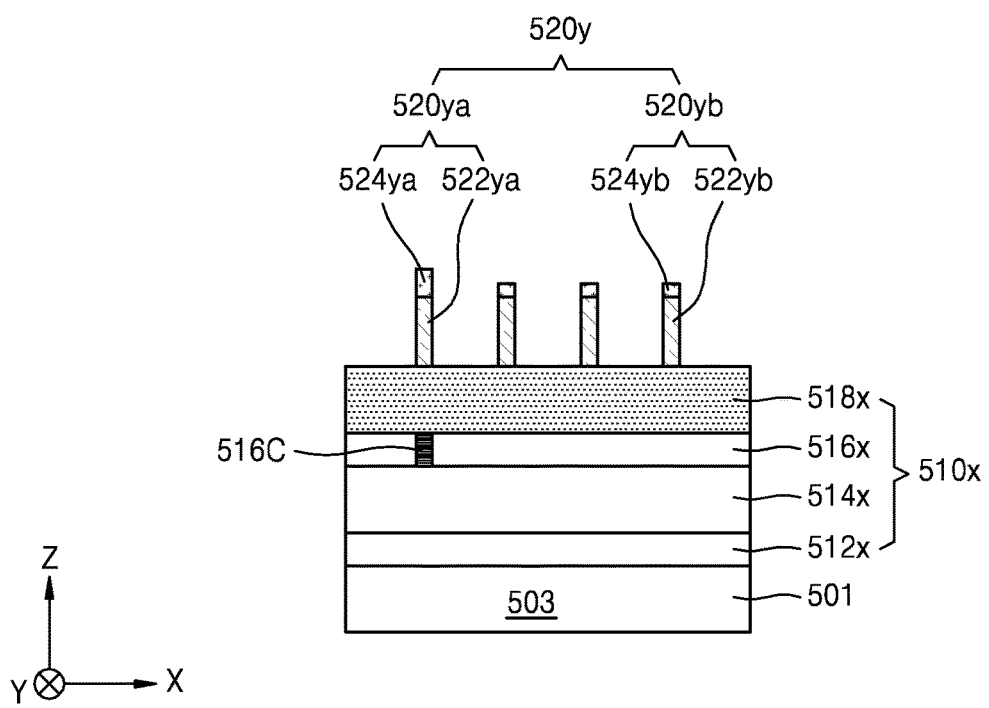

Referring to FIGS. 28A and 28B, the first photoresist pattern 538 is removed. Then, the first and second upper spacers 536a and 536b are used as an etch mask to etch the lower sacrificial layer 520x (refer to FIG. 27B), in order to form lower sacrificial pattern structures 520y. The etching of the lower sacrificial layer 520x may be performed, for example, by an anisotropic etching process.

The lower sacrificial pattern structures 520y may include a first lower sacrificial pattern structure 520ya and second lower sacrificial pattern structures 520yb.

A height of the first lower sacrificial pattern structure 520ya along the third direction (the Z axis direction) is greater than a height of each of the second lower sacrificial pattern structures 520yb along the third direction (the Z axis direction). This is because the first lower sacrificial pattern structure 520ya and the second lower sacrificial pattern structures 520yb are formed by an etching process using as an etch mask the first upper spacer 536a and the second upper spacers 536b, respectively, and the length of the first upper spacer 536a along the third direction (the Z axis direction) is greater than the length of each of the second upper spacers 536b along the third direction (the Z axis direction).

In some example embodiments, a length of a second lower material layer 524ya remaining in the first lower sacrificial pattern structure 520ya along the third direction (the Z axis direction) may be greater than a length of a second lower material layer 524yb remaining in each of the second lower sacrificial pattern structures 520yb along the third direction (the Z axis direction).

In example embodiments, the second lower material layer 524yb of each of the second lower sacrificial pattern structures 520yb may be completely removed by the etching process, and each of the second lower sacrificial pattern structures 520yb may be formed only of a first lower material layer 522yb.

Figure 29A:
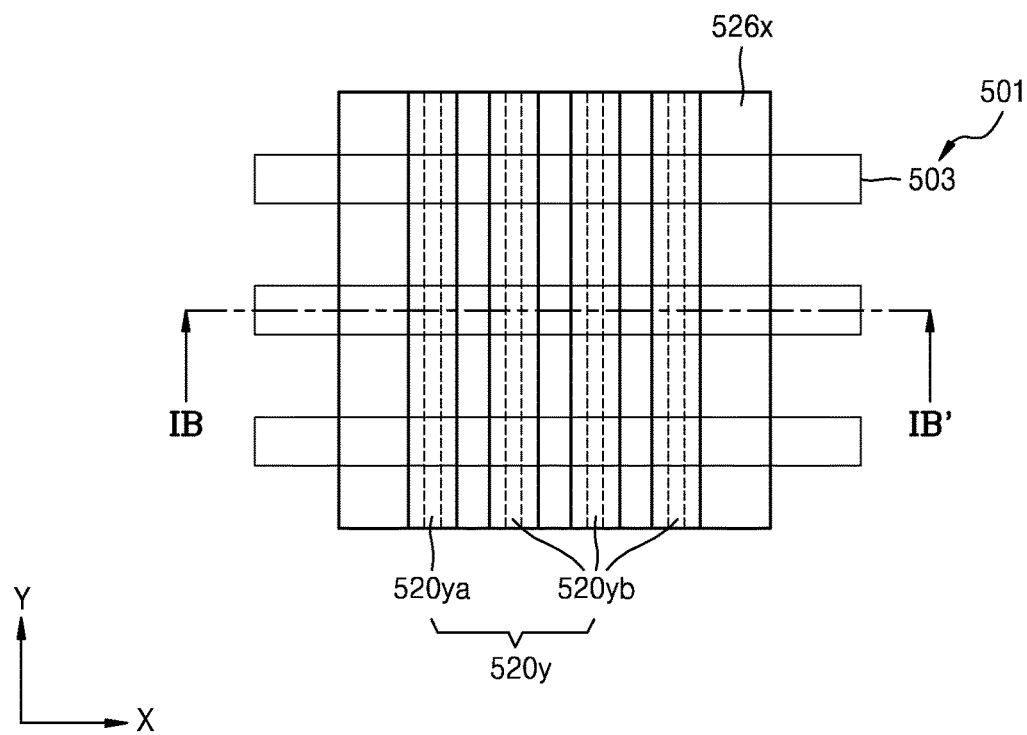
Figure 29B:
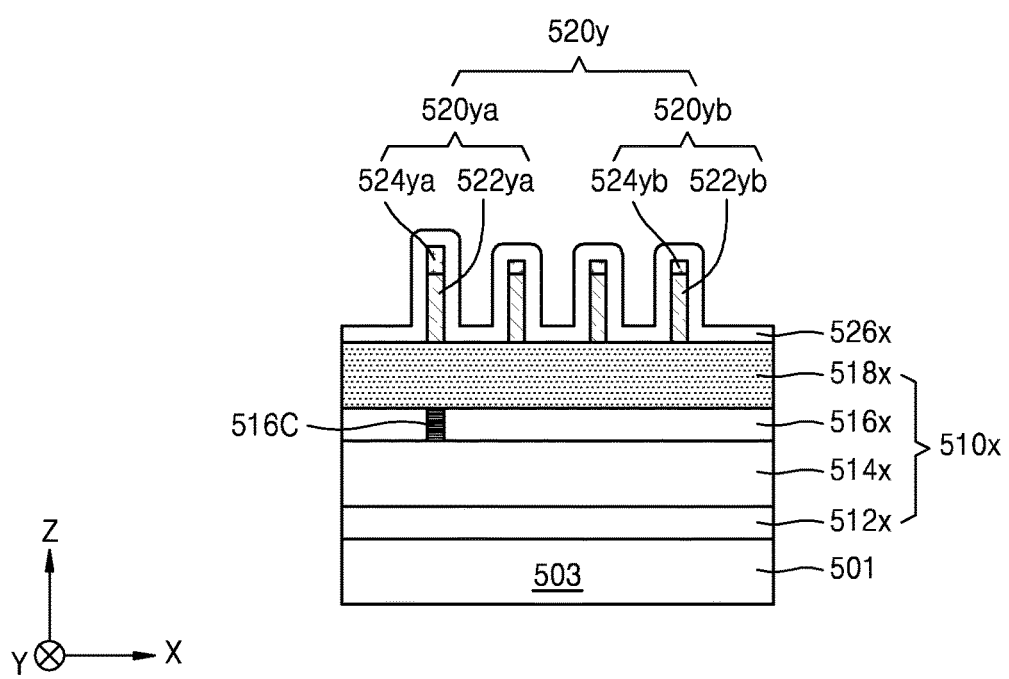

Referring to FIGS. 29A and 29B, a lower spacer layer 526x is formed and covers the lower sacrificial pattern structures 520y on the gate conductive layer 518x. The lower spacer layer 526x may be formed of substantially the same material and in substantially the same method as the lower spacer layer 326x described with reference to FIGS. 10A and 10B.

Figure 30A:
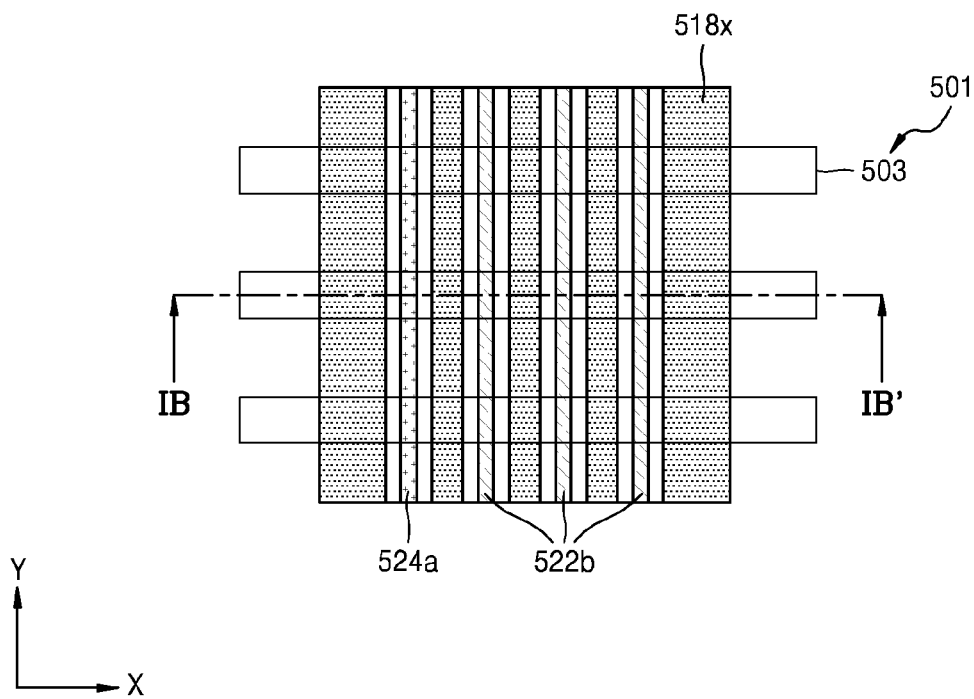
Figure 30B:
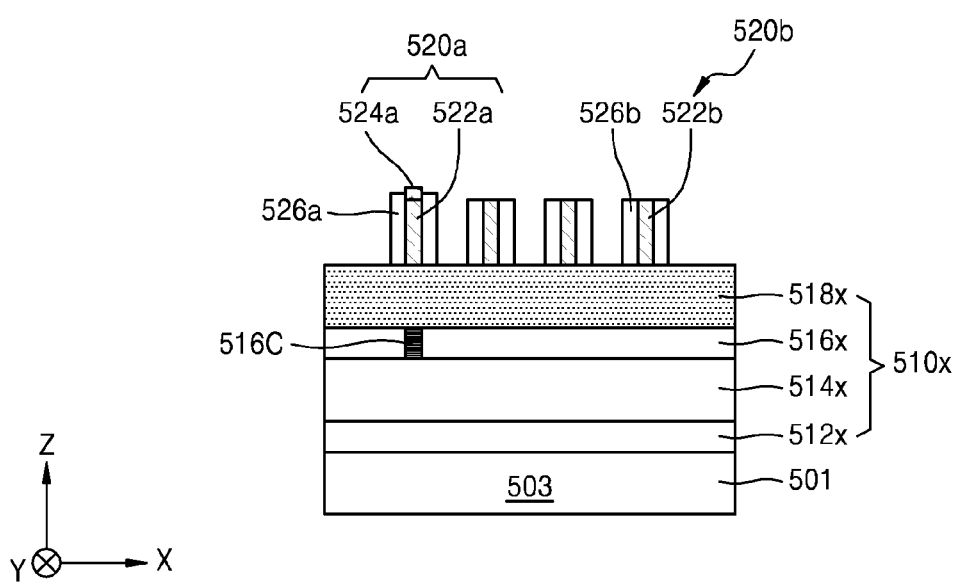

Referring to FIGS. 30A and 30B, lower spacers 526a and 526b are formed by etching the lower spacer layer 526x. The process of forming the lower spacers 526a and 526b may be performed by, for example, an anisotropic etching process.

During the etching of the lower spacer layer 526x, the first and second lower sacrificial pattern structures 520ya and 520yb may also be affected by the etching process. In detail, a portion of the second lower material layer 524ya of the first lower sacrificial pattern structure 520ya may be etched so that a first lower sacrificial pattern structure 520a, including a first lower material layer 522a and a second lower material layer 524a, may be formed. Also, the second lower material layer 524yb of each of the second lower sacrificial pattern structures 520yb is completely etched so that second lower sacrificial pattern structures 520b, including a first lower material layer 522b, may be formed.

Figure 31A:
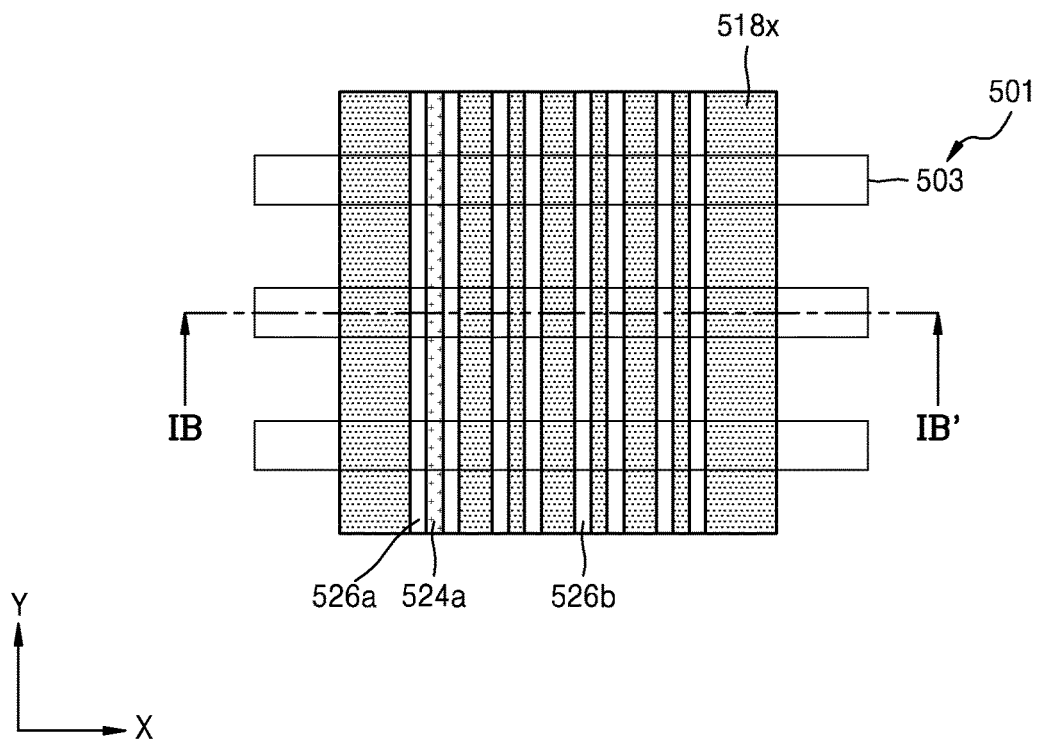
Figure 31B:
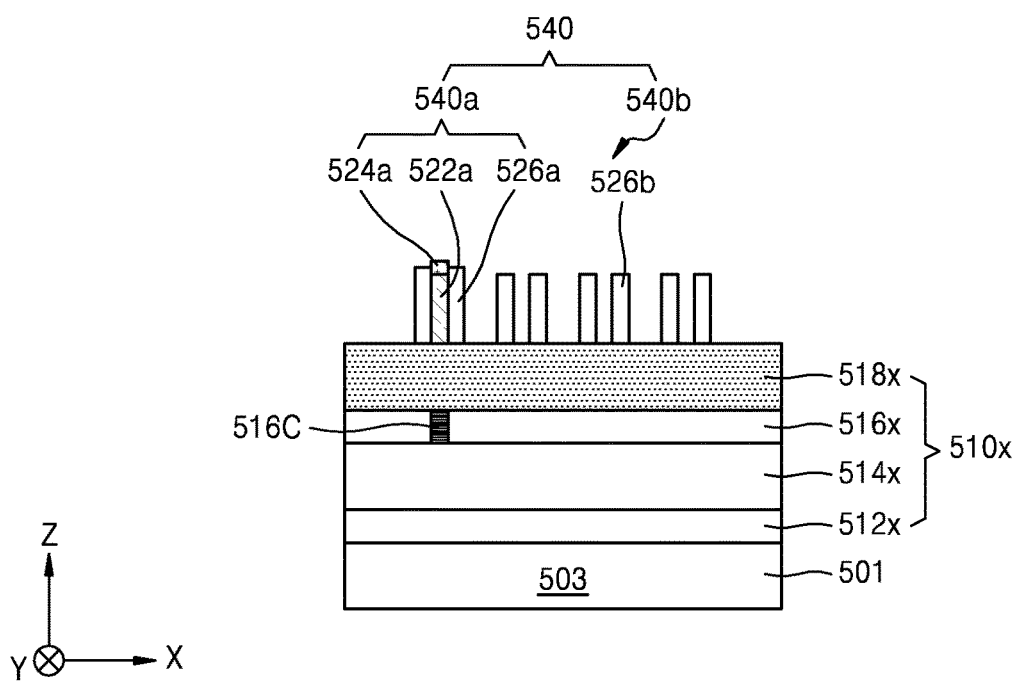

Referring to FIGS. 31A and 31B, a lower mask pattern 540 is completely formed by removing the first lower material layer 522b.

The removing of the first lower material layer 522b may be performed by, for example, an etching process, or an ashing or strip process.

Since the second lower material layer 524a has an etch selectivity with respect to the first lower material layer 522b, the second lower material layer 524a may remain after the removing of the first lower material layer 522b.

The first lower material layer 522a may also remain after the removing of the first lower material layer 522b, by being surrounded by the second lower material layer 524a and the lower spacer 526a.

Through the above-described process, a lower mask pattern 540, including a first line mask 540a formed of the lower spacer 526a, the first lower material layer 522a, and the second lower material layer 524a, and a second line mask 540b formed of the lower spacer 526b, is completely formed.

Figure 32A:
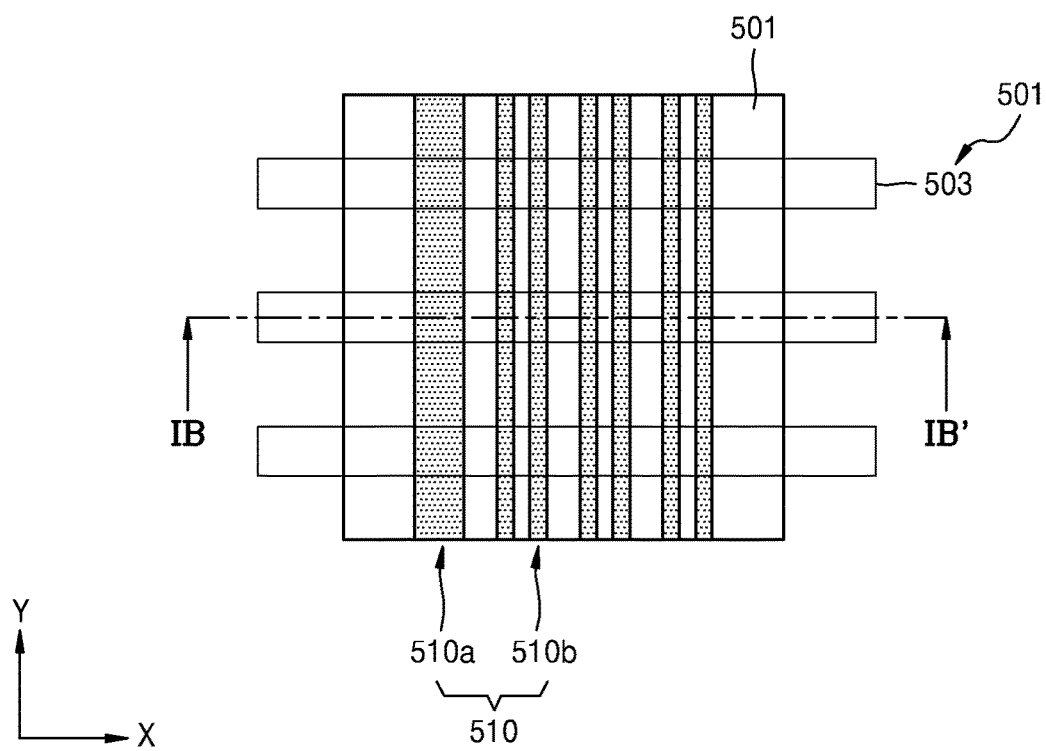
Figure 32B:
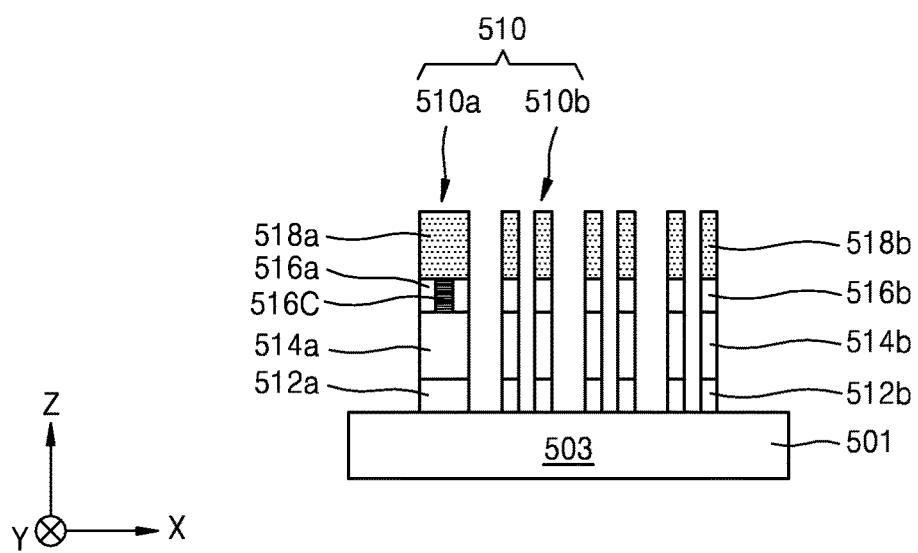

Referring to FIGS. 32A and 32B, the etching object layer 510x is etched by using the lower mask pattern 540 as an etch mask to form a pattern structure 510 including a first line pattern 510a and second line patterns 510b.

In some example embodiments, the first line pattern 510a may function as a selection line, such as a string selection line SSL or a ground selection line GSL, and each of the second line patterns 510b may function as a word line.

The second line patterns 510b in the present example embodiment are formed as six word lines. However, the number of word lines forming the second line patterns 510b is not limited thereto. For example, the number of second line patterns 510b may vary according to the number of upper sacrificial pattern masks 530y described with reference to FIGS. 25A and 25B.

Even when the number of upper sacrificial pattern masks 530y is the same as FIGS. 25A and 25B, the number of second line patterns 510b may vary. For example, even when two upper sacrificial pattern mask 530y are formed, as in the present example embodiment, the second line patterns 510b may be formed as four line patterns and the first line pattern 510a may be formed as two line patterns.

When the first line pattern 510a functions as the string selection line SSL, the tunneling insulating layer 512a may function as a gate insulating layer, and the charge storage layer 514a, the blocking insulating layer 516a including the butting contact hole 516C, and the gate conductive layer 518a may function as a gate electrode, since a selection transistor (not shown) included in the string selection line SSL does not need a data storage function.

By the processes described with reference to FIGS. 25A through 32B, the first and second line patterns 510a and 510b having different widths may be formed without performing an additional photo process. Accordingly, a process time and expenses may be reduced and also misalignment, which may occur due to the additional photo process, may be prevented.

While the inventive concepts have been particularly shown and described with reference to example embodiments thereof, it will be understood that various changes in form and details may be made therein without departing from the spirit and scope of the following claims.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims

What is claimed is:

1. A method of fabricating patterns for a flash memory device, the method comprising:
   sequentially forming an etching object layer and a lower sacrificial layer on a substrate;
   forming an upper sacrificial pattern structure including an upper sacrificial pad portion and an upper sacrificial line portion on the lower sacrificial layer;
   forming an upper spacer covering a side wall of the upper sacrificial pattern structure;
   forming a lower sacrificial pattern structure including a lower sacrificial pad portion and a lower sacrificial line portion by etching the lower sacrificial layer, using the upper sacrificial pad portion and the upper spacer as an etch mask;
   forming a lower spacer layer covering the lower sacrificial pattern structure; and
   forming a lower mask pattern including at least one line mask, at least one bridge mask, and at least one pad mask, by etching the lower spacer layer and at least a portion of the lower sacrificial pattern structure,
   wherein an upper surface of the lower sacrificial line portion includes a step portion.

2. The method of claim 1, wherein a line width of the at least one bridge mask is greater than a line width of the at least one line mask.

3. The method of claim 1, wherein at least one of the line masks is formed of a remaining portion of the lower spacer layer, and at least one of the bridge masks is formed of a remaining portion of the lower spacer layer and a remaining portion of the lower sacrificial pattern structure.

4. The method of claim 1, further comprising: forming a line pattern, a bridge pattern, and a contact pad by etching the etching object layer by using at least one of the line masks, at least one of the bridge masks, and at least one of the pad masks, respectively, as an etch mask.

5. The method of claim 4, wherein the line pattern comprises a word line or a bit line.

6. The method of claim 4, wherein an end of the line pattern is connected to at least one of the bridge pattern and the contact pad.

7. The method of claim 1, wherein an upper surface of the lower sacrificial pad portion includes a step portion.

8. The method of claim 1, wherein the forming of the upper spacer includes:
   forming an upper spacer layer covering the upper sacrificial pattern structure;
   forming a first photoresist pattern covering a portion of the upper spacer layer which is located at a side wall of the upper sacrificial line portion, and exposing a portion of the upper spacer layer which is located at the other side wall of the upper sacrificial line portion facing the side wall of the upper sacrificial line portion; and
   forming the upper spacer by using the first photoresist pattern as an etch mask.

9. The method of claim 1, wherein the forming of the upper spacer comprises:
   forming an upper spacer layer on the upper sacrificial pattern structure; and
   removing a portion of the upper spacer layer, and the upper sacrificial line portion.

10. A method of fabricating a flash memory device, the method comprising: sequentially forming an etching object layer and a lower sacrificial layer on a substrate;
    forming a plurality of upper sacrificial pattern structures on the lower sacrificial layer;
    forming a plurality of upper spacers by covering side walls of the upper sacrificial pattern structures; forming a plurality of lower sacrificial pattern structures, by etching the lower sacrificial layer using the upper spacers as an etch mask;
    forming a lower spacer layer covering the plurality of lower sacrificial pattern structures;
    forming a lower mask pattern, including a plurality of line masks, by etching the lower spacer layer and at least a portion of lower sacrificial pattern structure; and
    forming a first line pattern, and a second line pattern by etching the etching object layer, by using the lower mask pattern as an etch mask,
    wherein the first line pattern is a selection line including a string selection line (SSL) or a ground selection line (GSL), and each of the second line patterns is a word line (WL).

11. The method of fabricating a flash memory device of claim 10, wherein the forming of the etching object layer includes sequentially forming a stack of tunneling insulating layer, a charge storage layer, a blocking insulating layer, and a gate conductive layer on the substrate.

12. A method of fabricating a flash memory device, the method comprising:
- sequentially forming an etching object layer and a lower sacrificial layer on a substrate;
- forming a plurality of upper sacrificial pattern structures on the lower sacrificial layer;
- forming a plurality of upper spacers by covering side walls of the upper sacrificial pattern structures; forming plurality of lower sacrificial pattern structures, by etching the lower sacrificial layer using the upper spacers as an etch mask;
- forming a lower spacer layer covering the plurality of lower sacrificial pattern structures;
- forming a lower mask pattern, including a plurality of line masks, by etching the lower spacer layer and at least a portion of lower sacrificial pattern structure; and
- forming a first line pattern, and a second line pattern by etching the etching object layer, by using the lower mask pattern as an etch mask, wherein the forming of the upper spacer includes
- forming an upper spacer layer covering the upper sacrificial pattern structures;
- forming a first photoresist pattern exposing a portion of the upper spacer layer such that the photoresist covers a region of the upper spacer layer at a first side wall of the upper sacrificial pattern structure; and
- forming the upper spacer by using the first photoresist pattern as an etch mask.

13. The method of fabricating a flash memory device of claim 12, wherein
- the first side wall of the upper sacrificial pattern structure is located in an area perpendicularly overlapping a string selection line (SLL) or a ground selection line (GSL), and
- the etching object layer includes a blocking insulator layer having a butting contact below the first side wall.

* * * * *